(12) United States Patent
Cong et al.

(10) Patent No.: US 12,342,450 B2
(45) Date of Patent: Jun. 24, 2025

(54) POWER SUPPLY APPARATUS, LOAD AND ELECTRONIC DEVICE

(71) Applicant: Delta Electronics (Shanghai) CO., LTD, Shanghai (CN)

(72) Inventors: Wulong Cong, Shanghai (CN); Min Zhou, Shanghai (CN); Ziying Zhou, Shanghai (CN)

(73) Assignee: Delta Electronics (Shanghai) CO., LTD, Shanghai (CN)

( * ) Notice: Subject to any disclaimer, the term of this patent is extended or adjusted under 35 U.S.C. 154(b) by 6 days.

(21) Appl. No.: 18/354,684

(22) Filed: Jul. 19, 2023

(65) Prior Publication Data

US 2023/0363081 A1 Nov. 9, 2023
US 2024/0260170 A9 Aug. 1, 2024

Related U.S. Application Data

(63) Continuation-in-part of application No. 17/656,432, filed on Mar. 25, 2022, now Pat. No. 11,812,545,
(Continued)

(30) Foreign Application Priority Data

Jan. 8, 2020 (CN) .......................... 202010016898.7
Oct. 18, 2021 (CN) .......................... 202111210246.8
(Continued)

(51) Int. Cl.
*H05K 1/11* (2006.01)
*H05K 1/02* (2006.01)
(Continued)

(52) U.S. Cl.
CPC ......... *H05K 1/0213* (2013.01); *H05K 1/0231* (2013.01); *H05K 1/0298* (2013.01);
(Continued)

(58) Field of Classification Search
CPC ......... G06F 1/189; G06F 1/26; H05K 1/0213; H05K 1/0216; H05K 1/0228;
(Continued)

(56) References Cited

U.S. PATENT DOCUMENTS 5,798,567 A   8/1998  Kelly et al.
6,225,702 B1* 5/2001  Nakamura ........ H01L 23/49838
                                                 257/E23.079
(Continued)

FOREIGN PATENT DOCUMENTS

CA     2647863 A1   7/2009
CN   101211792 A    7/2008
(Continued)

OTHER PUBLICATIONS

2nd Office Action dated Apr. 25, 2024 for Chinese Application No. 202010016898.7.
(Continued)

*Primary Examiner* — Levi Gannon
(74) *Attorney, Agent, or Firm* — Qinghong Xu

(57) ABSTRACT

An electronic device includes: a system board; a load, located on the first side of the system board and including a power supply region, the power supply region includes load pins arranged in a plurality of rows and in a plurality of columns; and at least one column of output capacitors, located on the second side of the system board along a third direction; at least one row of the load pins is a first arrangement row, the first arrangement row includes a plurality of load pin groups arranged sequentially along the second direction, each of the load pin groups includes at least two load pins of a same polarity; and two ends of a vertical projection of each column of the output capacitors
(Continued)

on the power supply region are located at two sides of a centerline, in the third direction, of at least one first position pin.

20 Claims, 31 Drawing Sheets

Related U.S. Application Data which is a continuation-in-part of application No. 17/108,040, filed on Dec. 1, 2020, now Pat. No. 11,320,879.

(30) Foreign Application Priority Data

| Dec. 28, 2021 | (CN) | .......................... 202111626437.2 |
| Mar. 23, 2023 | (CN) | .......................... 202310294700.5 |

(51) Int. Cl.
   *H05K 1/14* (2006.01)
   *H05K 1/18* (2006.01)
   *H05K 7/02* (2006.01)

(52) U.S. Cl.
   CPC .............. *H05K 1/111* (2013.01); *H05K 1/115* (2013.01); *H05K 1/141* (2013.01); *H05K 1/144* (2013.01); *H05K 1/181* (2013.01); *H05K 7/023* (2013.01); *H05K 2201/10015* (2013.01)

(58) Field of Classification Search
   CPC .. H05K 1/0231; H05K 1/0265; H05K 1/0287; H05K 1/0296; H05K 1/0298; H05K 1/11; H05K 1/111; H05K 1/115; H05K 1/14; H05K 1/141; H05K 1/144; H05K 1/181; H05K 7/02; H05K 7/023; H05K 2201/10015
   See application file for complete search history.

(56) References Cited

U.S. PATENT DOCUMENTS

| 6,346,679 | B1* | 2/2002 | Nakamura | .............. H01L 24/73 |
| | | | | 361/767 |
| 6,362,986 | B1 | 3/2002 | Schultz et al. | |
| 6,479,758 | B1* | 11/2002 | Arima | .................... H05K 1/113 |
| | | | | 257/E23.079 |
| 6,740,965 | B2* | 5/2004 | Hsu | ......................... H01L 23/50 |
| | | | | 257/E23.079 |
| 7,449,799 | B2 | 11/2008 | Levin et al. | |
| 8,395,404 | B2* | 3/2013 | Kaku | ............... H01L 23/49838 |
| | | | | 324/750.3 |
| 10,395,819 | B2 | 8/2019 | Wukovits et al. | |
| 2004/0027813 | A1 | 2/2004 | Li | |
| 2004/0124511 | A1 | 7/2004 | Li | |
| 2005/0169033 | A1* | 8/2005 | Sugita | ................... H01L 23/552 |
| | | | | 365/63 |
| 2005/0274982 | A1 | 12/2005 | Ueda et al. | |
| 2006/0181857 | A1 | 8/2006 | Belady et al. | |
| 2007/0045815 | A1 | 3/2007 | Urashima et al. | |
| 2007/0188997 | A1* | 8/2007 | Hockanson | ............. G06F 1/182 |
| | | | | 257/E23.079 |
| 2009/0290316 | A1 | 11/2009 | Kariya | |
| 2009/0296360 | A1 | 12/2009 | Doblar et al. | |
| 2010/0258952 | A1 | 10/2010 | Fjelstad | |
| 2011/0080717 | A1 | 4/2011 | Koide et al. | |
| 2014/0133115 | A1 | 5/2014 | Iguchi | |
| 2014/0334121 | A1* | 11/2014 | Ito | .......................... H05K 1/114 |
| | | | | 361/767 |
| 2015/0054611 | A1 | 2/2015 | Cambronero Garcia | |
| 2015/0117862 | A1* | 4/2015 | Trotta | ................ H04B 10/2575 |
| | | | | 398/115 |
| 2016/0300659 | A1 | 10/2016 | Zhang et al. | |
| 2016/0379952 | A1 | 12/2016 | Cahill et al. | |
| 2017/0048963 | A1 | 2/2017 | Murakami | |
| 2017/0069607 | A1 | 3/2017 | Yap | |
| 2018/0032117 | A1 | 2/2018 | Leigh et al. | |
| 2018/0076718 | A1 | 3/2018 | Zeng et al. | |
| 2019/0074771 | A1 | 3/2019 | Zeng et al. | |
| 2019/0254166 | A1 | 8/2019 | Ji et al. | |
| 2019/0320554 | A1 | 10/2019 | Nakajima et al. | |
| 2020/0211977 | A1 | 7/2020 | Kim et al. | |
| 2020/0260586 | A1 | 8/2020 | Hong et al. | |
| 2021/0280354 | A1 | 9/2021 | Xiong et al. | |

FOREIGN PATENT DOCUMENTS

| CN | 103730434 | A | 4/2014 |
| CN | 103871716 | A | 6/2014 |
| CN | 104112727 | A | 10/2014 |
| CN | 102576593 | B | 12/2014 |
| CN | 105449987 | A | 3/2016 |
| CN | 102648667 | B | 9/2016 |
| CN | 106329930 | A | 1/2017 |
| CN | 107154385 | A | 9/2017 |
| CN | 206726916 | U | 12/2017 |
| CN | 107545974 | A | 1/2018 |
| CN | 108962556 | A | 12/2018 |
| CN | 110112905 | A | 8/2019 |
| CN | 111313655 | A | 6/2020 |
| CN | 212086589 | U | 12/2020 |
| CN | 112788842 | A | 5/2021 |
| IN | 201914054517 | | 12/2019 |
| IN | 202014000536 | A | 1/2020 |
| JP | H097862 | A | 1/1997 |
| JP | 2012124977 | A | 6/2012 |
| JP | 2019079943 | A | 5/2019 |

OTHER PUBLICATIONS

Non-Final Office Action dated Nov. 24, 2023 of U.S. Appl. No. 17/105,650.
The 1st office action dated Jan. 24, 2022 for CN patent application No. 202010018822.8.
The 1st Office Action dated Dec. 31, 2021 for CN patent application No. 202010018831.7.
The 1st Office Action dated Dec. 16, 2021 for IN patent application No. 202014054043.
The 1st Office Action dated Sep. 23, 2021 for IN patent application No. 202034053622.
The Non-Final OA dated May 10, 2021 for U.S. Appl. No. 17/108,040.
The Non-Final OA dated Jul. 11, 2022 for U.S. Appl. No. 17/102,393.
1st Office Action dated Aug. 29, 2023 for Chinese Application No. 202010016898.7.
The Non-Final OA dated Feb. 6, 2023 for U.S. Appl. No. 17/656,432.
Non-final OA dated Feb. 13, 2025 of U.S. Appl. No. 18/354,689.

\* cited by examiner

POWER SUPPLY APPARATUS, LOAD AND ELECTRONIC DEVICE

CROSS-REFERENCE TO RELATED APPLICATIONS

This application is a continuation-in-part application of U.S. application Ser. No. 17/656,432 filed on Mar. 25, 2022, which is a continuation-in-part application of U.S. application Ser. No. 17/108,040 filed on Dec. 1, 2020 and entitled "POWER SUPPLY MODULE AND ELECTRONIC DEVICE", which is based upon and claims priority to Chinese Patent Application No. 2020100168987, filed on Jan. 8, 2020, and further claims priority to Chinese Patent Application No. 2021112102468, filed on Oct. 18, 2021 and Chinese Patent Application No. 2021116264372, filed on Dec. 28, 2021. This application also claims priority to China Patent Application No. 2023102947005 filed on Mar. 23, 2023. The entire contents thereof are herein incorporated by reference for all purpose.

TECHNICAL FIELD

The present invention relates to the technical field of power electronics, in particular to a power supply apparatus, a load and an electronic device.

BACKGROUND

With the rapid development of mobile Internet, big data and artificial intelligence, more and more massive data needs to be processed, analyzed and calculated, and the computing capability of the processor (such as CPU, GPU, DPU, etc.) chip is getting higher and higher. The higher the computing capability, the larger the power supply current the power supply apparatus needs to provide to the processor chip. The most common power supply mode is the horizontal power supply mode shown in FIG. 20 and FIG. 21, wherein the power supply apparatus 103 and the processor chip 102 are located on the same side of the system board 101. In order to transfer current from the power supply apparatus 103 to the processor chip 102, the Vo pins (power supply output pins 1031) of the power supply apparatus 103 and the Vo pins (load input pins 1021) of the processor chip 102 are all connected through the system board 101 wiring (PCB wiring), and the GND pins (power supply ground pins 1032) of the power supply apparatus 103 and the GND pins (load ground pins 1022) of the processor chip 102 are all connected through the system board 101 wiring (PCB wiring). The Vo pins and GND pins of the processor chip 102 are generally arranged alternatively to get a better decoupling effect, so that the PCB wiring below the processor chip 102 will form a zigzag pattern in order to connect the Vo pins and GND pins respectively. To ensure stable and reliable power supply to the processor chip 102, a certain number of output capacitors 104 must be placed at the back side of the system board 101, facing the processor, and the output capacitors 104 are electrically connected to the processor chip 102 through system board vias 1011. In addition to interconnecting the processor chip 102 at the front side of the system board 101 and the output capacitors 104 at the back side of the system board 101, the system board vias 1011 may also interconnect the multi-layer wiring inside the system board 101. The multi-layer wiring interconnection provides more paths for current transfer to the processor chip 102, increasing the through-current area and reducing the through-current impedance, to meet the demand for high-current power supply.

However, even with the use of system board vias 1011 to interconnect the multi-layer wiring inside the system board 101, the distance L from the power supply apparatus 103 to the pins of the processor chip 102 still generates significant losses in higher current power supply applications. Through simulation and actual measurement, when the current of the processor chip 102 reaches about 500 A, the loss of the horizontally powered system board 101 reaches 5.1% of the overall output power. When the current of the processor chip 102 reaches 1000 A, the loss of the system board 101 reaches 10.2% of the overall output power. These losses have seriously reduced the power supply efficiency of the system.

Currently, vertical power supply is a possible solution to solve the loss problem caused by high current horizontal power supply. The structure of an existing vertically powered electronic device is shown in FIG. 22. Unlike the horizontal power supply, for the vertical power supply, the power supply apparatus 103 and the processor chip 102 are vertically distributed, and are placed on the upper and lower sides of the system board 101 respectively, causing that the power supply apparatus 103 is closer to the processor chip 102 and the current output from the power supply apparatus 103 reaches the processor chip 102 directly after passing through the system board 101. This greatly reduces the loss caused by the long wiring distance from the power supply apparatus 103 to the processor chip 102 in the horizontal power supply applications, and the loss value can be reduced from 5%-10% to less than 1%.

However, the vertical power supply also needs to meet the following requirements.

Requirement 1, since the output capacitors 104 need to be connected to the back of the system board 101, the pins of the power supply apparatus 103 also need to be connected to the back of the system board 101, and both the output capacitors 104 and the power supply apparatus 103 are placed vertically with the processor chip 102, the output capacitors 104 and the power supply apparatus 103 need to be reasonably placed to avoid each other.

Requirement 2, the placement requirements of the output capacitors 104 need to be met. Because the processor chip 102 has a plurality of Vo pins and GND pins, a Vo pin and a GND pin adjacent to each other may be called a pin pair, and in principle, the output capacitor 104 at the back side of the system board needs to be placed in close proximity to each pin pair to provide a better filtering effect.

Requirement 3, the current path from the power supply apparatus 103 to the processor chip 102 is: the pins of the power supply apparatus 103→the system board vias 1011 of the soldering surface→system board 101 wiring→processor chip 102. Since the vias 1011 of the system board 101 have a limitation of maximum through-current capability, and only one via 1011 can be placed between adjacent pins of the processor chip 102 on the system board 101, so the number of the vias 1011 and the number of the pins of the processor chip 102 are close and limited. Therefore, the pins of the power supply apparatus 103 need to be connected to as many vias 1011 as possible in close proximity so that the value of current passing through a single vias 1011 does not exceed the physical limit that the system board vias 1011 can withstand.

To meet the above requirements, a schematic diagram of another electronic device in related arts as shown in FIG. 23 is proposed. To meet requirement 1, the related arts integrate the output capacitors 104 into the power supply apparatus 103, causing that the output capacitors 104 are not placed directly on the system board 101, and the pins of the power supply apparatus 103 do not need to be placed avoiding the output capacitors 104. To meet requirement 3, the pins of the power supply apparatus 103 and the pins of the processor chip 102 are arranged in the same way and are connected relative to each other. Because there are corresponding system board vias 1011 near each pin of the processor chip 102, the power supply apparatus 103 can connect more system board vias 1011.

However, the structure shown in FIG. 23 does not meet the requirement 2 well. Since the output capacitors 104 are integrated into the power supply apparatus 103, to achieve the connection between the output capacitors 104 and the system board 101, the current need is to pass through the PCB board 1033 of the power supply apparatus and the pins 1031,1032 of the power supply apparatus 103. This manner has a large connection impedance, which affects the filtering effect, resulting in that more output capacitors 104 are needed to be integrated in the power supply apparatus 103 to achieve the original expected filtering effect.

It should be noted that the information disclosed in the background section above is intended only to enhance the understanding of the background of the present disclosure and may include information that does not constitute prior art known to those ordinary skilled in the art.

SUMMARY

According to a first aspect of the present disclosure, an electronic device is provided. The electronic device includes:
- a system board, including a first side and a second side, the first side and the second side are located opposite to each other along a first direction;
- a load, located on the first side of the system board and including a power supply region, the power supply region includes load pins arranged in a plurality of rows along a second direction and in a plurality of columns along a third direction; and
- at least one column of output capacitors, each column of the output capacitors is located on the second side of the system board along the third direction;
- at least one row of the load pins is a first arrangement row, and the first arrangement row includes a plurality of load pin groups arranged sequentially along the second direction, each of the load pin groups includes at least two load pins of a same polarity, and each of the load pin groups and an adjacent load pin group are of opposite polarities;
- a first load pin in the second direction of each of the load pin groups in the first arrangement row is a first position pin, and two ends of a vertical projection of each column of the output capacitors on the power supply region are located at two sides of a centerline, in the third direction, of at least one first position pin; and
- the first direction, the second direction and the third direction are perpendicular to each other.

According to a second aspect of the present disclosure, a power supply apparatus is provided. The power supply apparatus is configured to supply power to a load on a system board, and the system board includes a first side and a second side, the first side and the second side are located opposite to each other along a first direction;
- the load is located on the first side of the system board and includes a power supply region, the power supply region includes load pins arranged in a plurality of rows along a second direction and in a plurality of columns along a third direction;
- the power supply apparatus is located on the second side of the system board, one side of the power supply apparatus facing the system board is provided with a plurality of power supply pins, and each of the power supply pins is connected to the load pin of a same polarity through a conductive structure of the system board;
- at least one column of output capacitors is connected in parallel between the power supply apparatus and the load, and each column of the output capacitors is located on the second side of the system board along the third direction;
- at least one row of the load pins is a first arrangement row, and the first arrangement row includes a plurality of load pin groups arranged sequentially along the second direction, each of the load pin groups includes at least two load pins of a same polarity, and each of the load pin groups and an adjacent load pin group are of opposite polarities;
- a first load pin in the second direction of each of the load pin groups in the first arrangement row is a first position pin, and two ends of a vertical projection of each column of the output capacitors on the power supply region are located at two sides of a centerline, in the third direction, of at least one first position pin; and
- the first direction, the second direction and the third direction are perpendicular to each other.

According to a third aspect of the present disclosure, a load is provided. The load includes:
- a power supply region, the power supply region includes load pins arranged in a plurality of rows along a second direction and in a plurality of columns along a third direction;
- at least one row of the load pins is a first arrangement row, the first arrangement row includes a plurality of load pin groups arranged sequentially along the second direction, each of the load pin groups includes at least two load pins of a same polarity, and each of the load pin groups and an adjacent load pin group are of opposite polarities;
- at least one row of the load pins is a second arrangement row, an arrangement of the load pins of the second arrangement row is shifted by one load pin along the second direction relative to an arrangement of the load pins of the first arrangement row;
- the at least one first arrangement row and the at least one second arrangement row are provided adjacent to each other; and
- the second direction and the third direction are perpendicular to each other.

According to a fourth aspect of the present disclosure, an electronic device is provided. The electronic device includes the load according to the third aspect. The electronic device further includes a power supply apparatus, at least one column of output capacitors, and a system board, the system board includes a first side and a second side located opposite to each other along a first direction, the load is located on the first side of the system board, and the power supply apparatus and the output capacitors are located on the second side of the system board.

Figure 1:
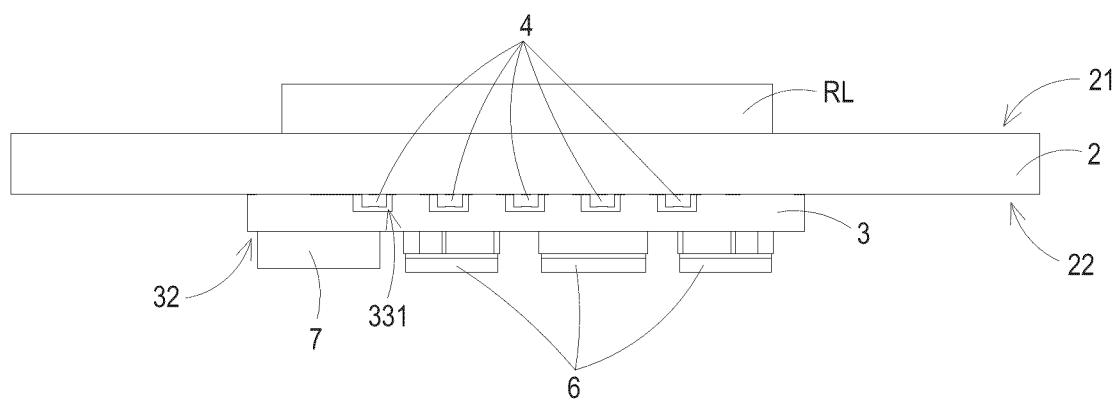
FIG. 1 is a schematic cross-sectional structure diagram of a power supply system according to a first embodiment of the disclosure.

REFERENCE NUMERALS in related arts:
101: system board
1011: system board via
102: processor chip
1021: load input pin
1022: load ground pin
103: power supply apparatus
1031: power supply output pin
1032: power supply ground pin
1033: PCB board of the power supply apparatus
1034: PCB board via of the power supply apparatus
104: output capacitor
in the present disclosure:
1, 1$a$, 1$b$, 1$c$: Power Supply System
Vin: Input Voltage
RL, 82: Load
Cin: Input Capacitor
Q1, Q2: Switching Element
L: Inductor
Co: Output Capacitor
Vin+: Positive Input Terminal
Vin−: Negative Input Terminal
Vout+: Positive Output Terminal
Vout−: Negative Output Terminal
2, 81: System Board
21, 811: First Side of System Board
22, 812: Second Side of System Board
3, 3$a$, 3': Substrate
31: First Side of Substrate
32: Second Side of Substrate
331: First Accommodating Groove
331$a$: Second Accommodating Groove 331b: Third Accommodating Groove
331c: Fourth Accommodating Groove
332: Connection Hole
333: Copper Pillar
334, 813: Conductive Structure
34: First Sidewall of Substrate
35: Second Sidewall of Substrate
36: Third Sidewall of Substrate
37: Fourth Sidewall of Substrate
381: Controller Pad
382: Capacitor Pad
39, 39a: Power Unit Pad
391: Signal Terminal
392: Input Terminal
393: Output Terminal
394: Ground Terminal
395: First Sidewall of Power unit Pad
396: Second Sidewall of Power unit Pad
397: Third Sidewall of Power unit Pad
398: Fourth Sidewall of Power unit Pad
O: Center Point
4, 84: Output Capacitor
51: Positive Output Conductive-connected region
511: Sub-Positive Output Conductive-connected region
52: Negative Output Conductive-connected region
521: Sub-Negative Output Conductive-connected region
53: Positive Input Conductive-connected region
531: Sub-Positive Input Conductive-connected region
54: Negative Input Conductive-connected region
541: Sub-Negative Input Conductive-connected region
6: Power unit
601: Positive Output Terminal of Power Unit
602: Negative Output Terminal of Power Unit
61: First Arrangement Row
62: Second Arrangement Row
63: Third Arrangement Row
64: Fourth Arrangement Row
7: Controller
821: load input pin
822: load ground pin
823: load pin group
8231: first position pin
83: power supply apparatus
831: power supply output pin
832: power supply ground pin
100: electronic device

DETAILED DESCRIPTION

Example embodiments will be described more comprehensively with reference to the accompanying drawings. However, the example embodiments may be implemented in a variety of forms and should not be construed as being limited to the embodiments set forth herein. On the contrary, the provision of these embodiments allows the present disclosure to be comprehensive and complete and communicates the idea of the example embodiments to those skilled in the art in a comprehensive manner. The same reference numerals in the drawings represent the same or similar structures, and thus repetitive descriptions for them will be omitted. The term "or" in the specification may indicate "and" or "or". Although the terms "on", "below", "between", etc., may be used in the specification to describe different exemplary features and components of the present disclosure, these terms are only used for convenience herein, for example, according to the direction of the examples described in the accompanying drawings. Nothing in the specification should be understood as requiring a specific three-dimensional direction of the structure to fall within the scope of the present disclosure. Although the terms "first" or "second" are used in the specification to represent certain features, they are only used for representational purposes only and are not intended to limit the number or importance of a specific feature.

For the problems in the related arts, the purpose of the present disclosure is to provide a power supply apparatus, a load and an electronic device, which facilitates the improvement of the power supply capability to the load.

Some typical embodiments that embody the features and advantages of the present disclosure will be described in detail in the following description. It should be understood that the present disclosure has various changes in different embodiments without departing from the scope of the present disclosure, and the descriptions and drawings therein are for illustrative purposes only, rather than for limiting the present disclosure.

Figure 2:
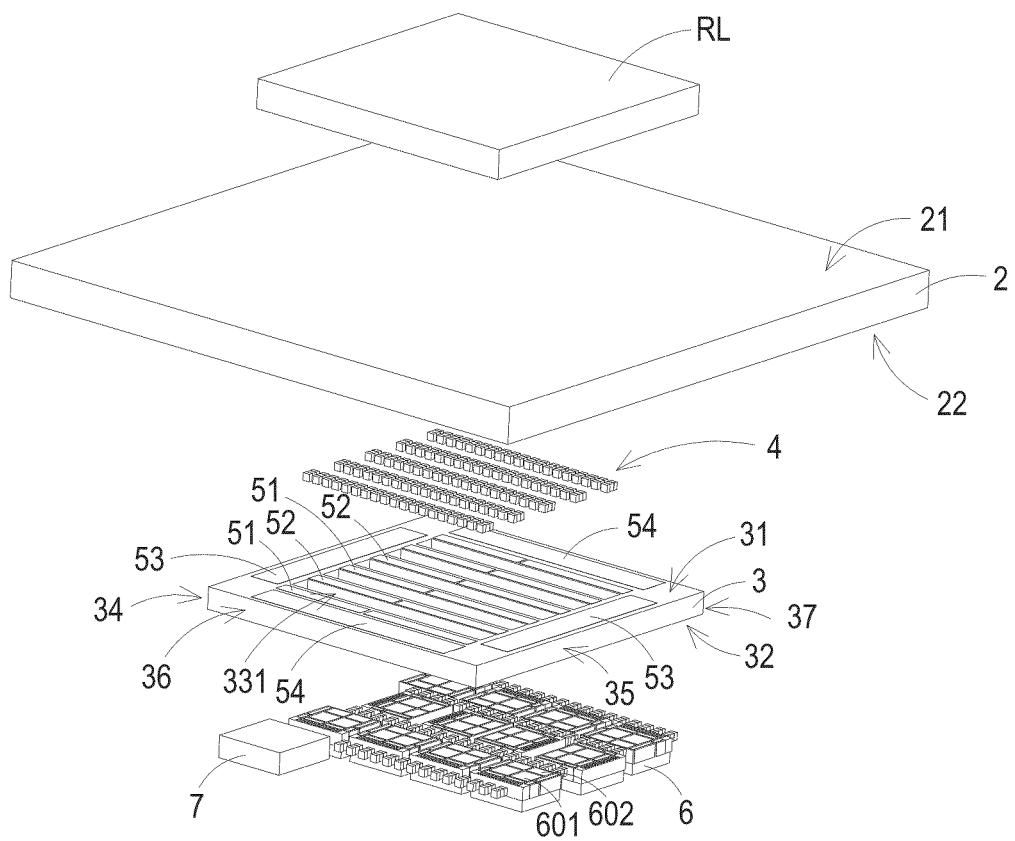
FIG. 2 is a schematic diagram of an exploded structure of the power supply system shown in FIG. 1.
Figure 3A:
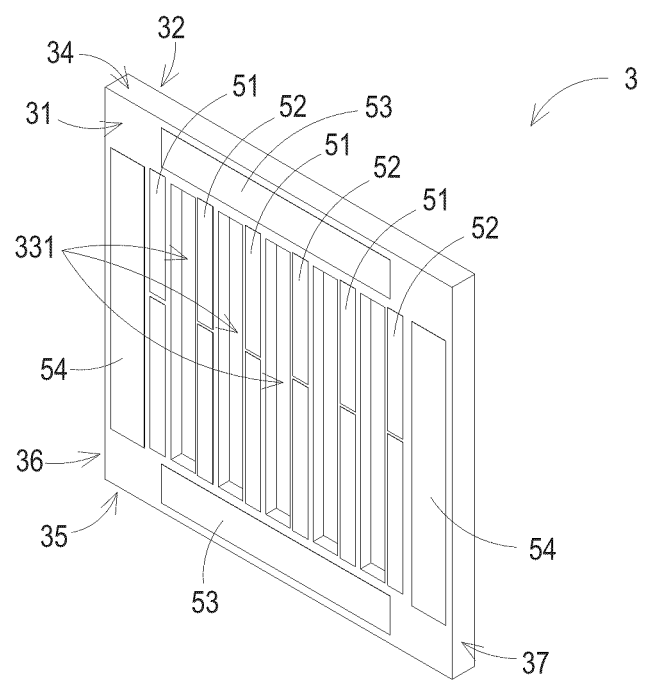
FIGS. 3A and 3B are schematic structural diagrams of a substrate of the power supply system shown in FIG. 1 from two different viewing angles.
Figure 3B:
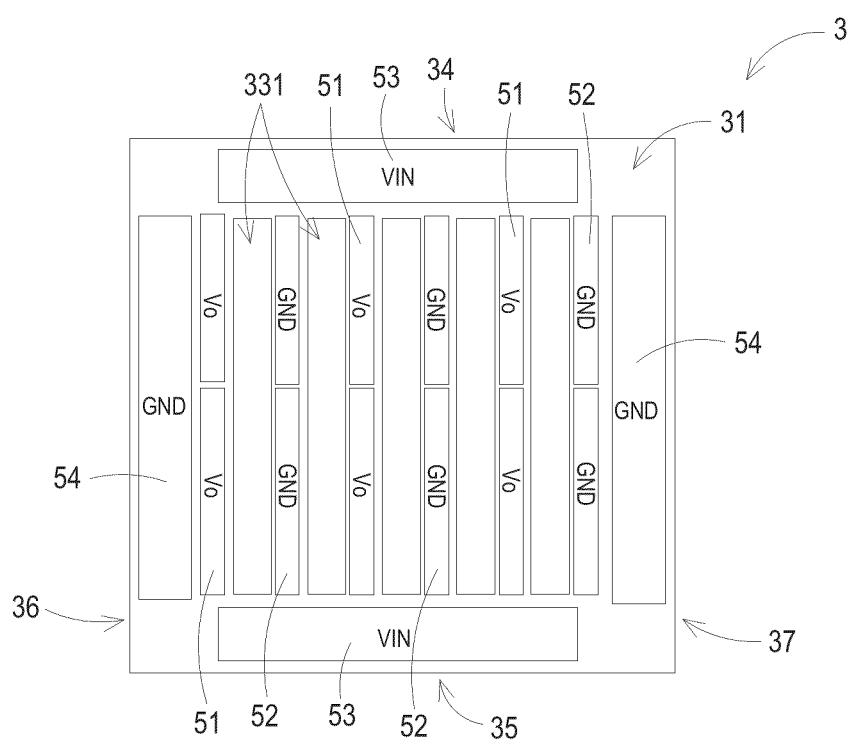
Figure 3C:
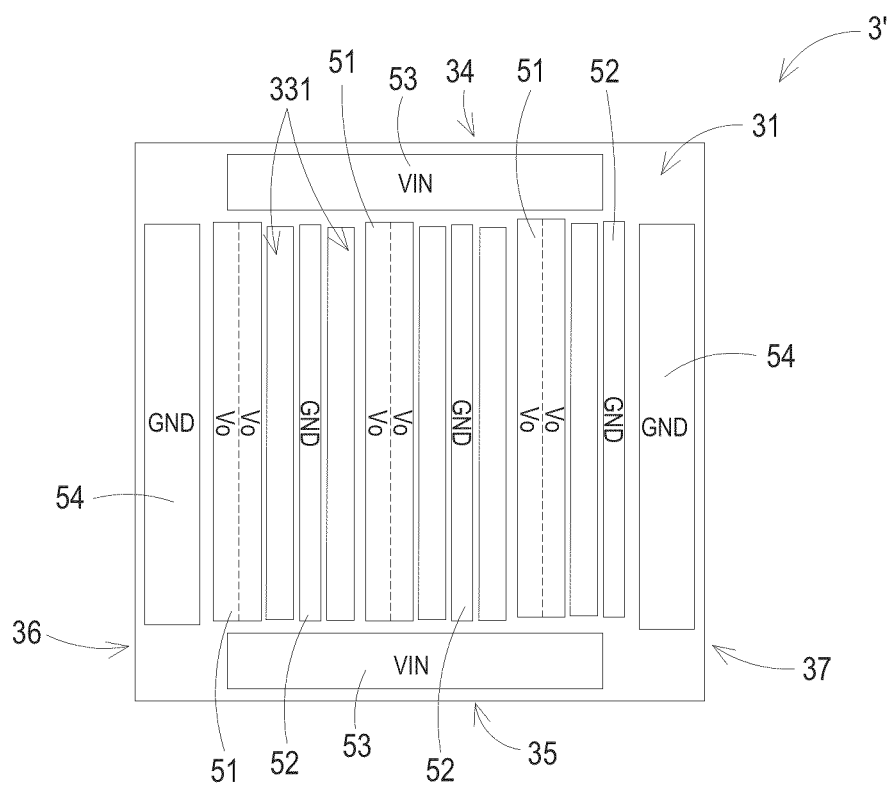
FIG. 3C is a schematic structural diagram of another embodiment of the substrate of the power supply system shown in FIG. 1.
Figure 3D:
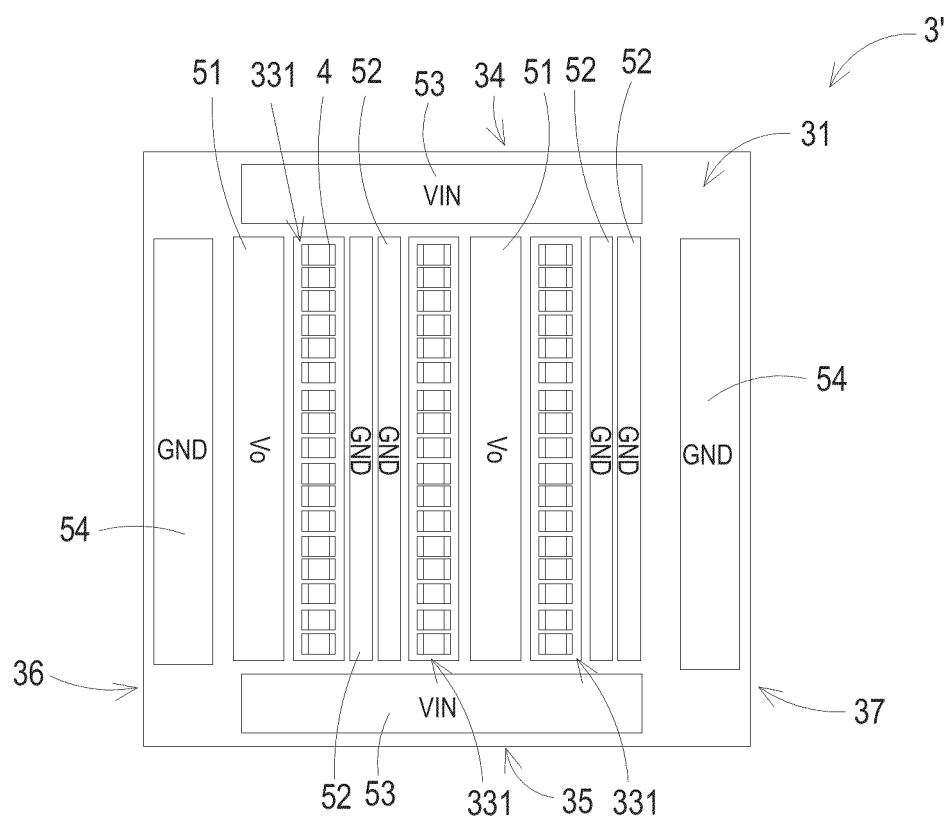
FIG. 3D is a schematic structural diagram of another embodiment of the substrate of the power supply system shown in FIG. 1.
Figure 3E:
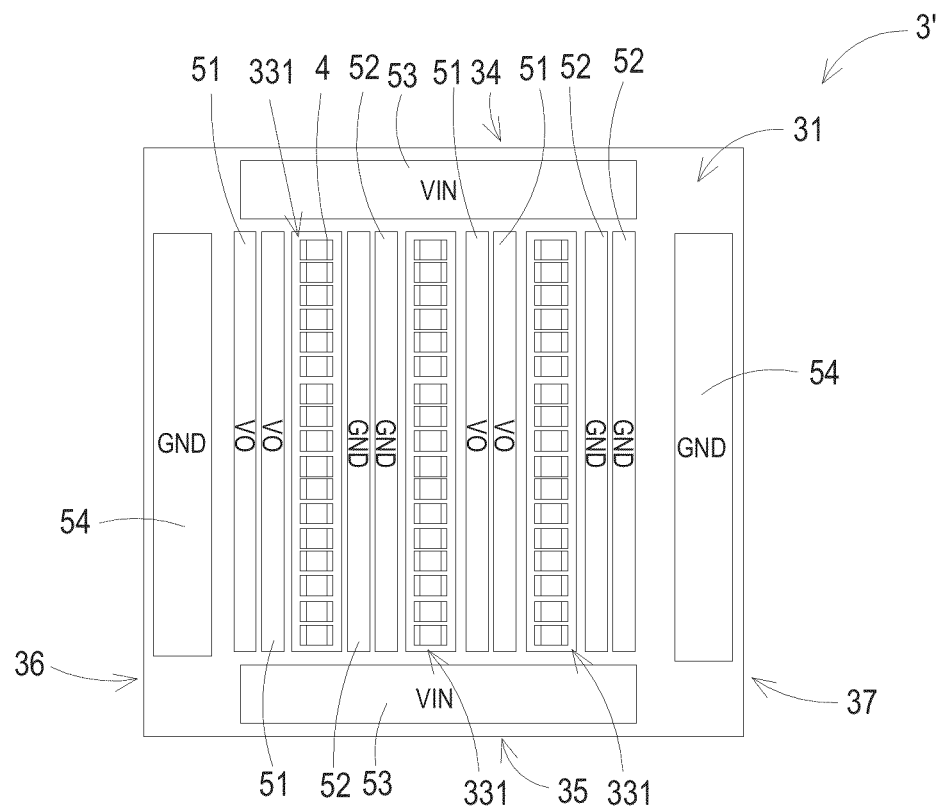
FIG. 3E is a schematic structural diagram of another embodiment of the substrate of the power supply system shown in FIG. 1.
Figure 3F:
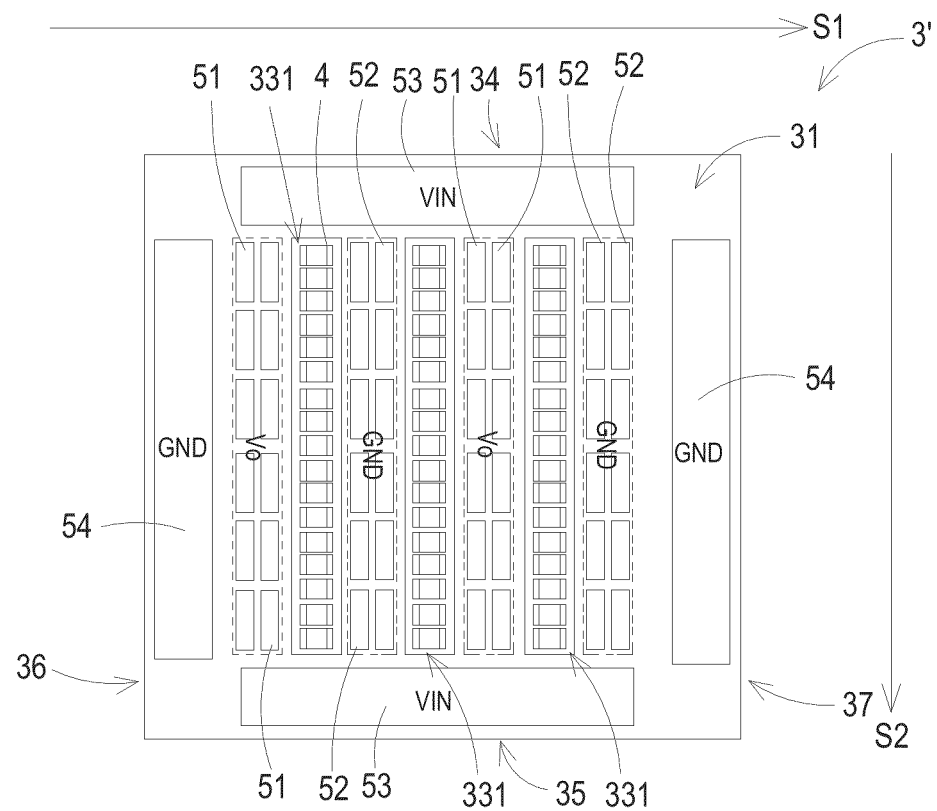
FIG. 3F is a schematic structural diagram of another embodiment of the substrate of the power supply system shown in FIG. 1.
Figure 3G:
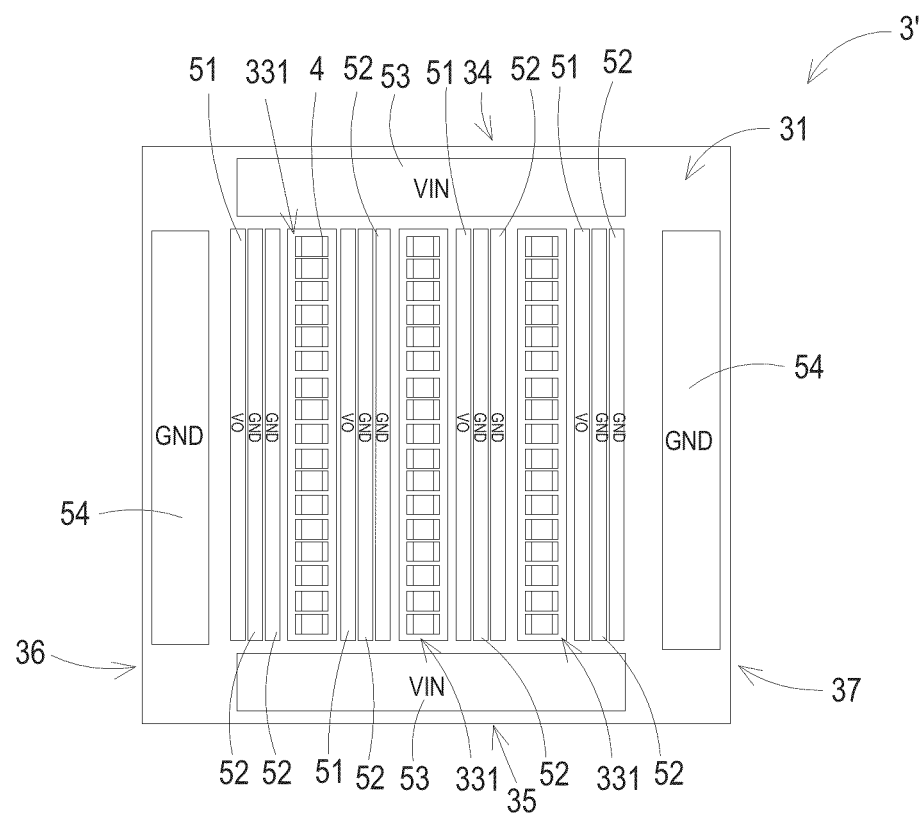
FIG. 3G is a schematic structural diagram of another embodiment of the substrate of the power supply system shown in FIG. 1.
Figure 4:
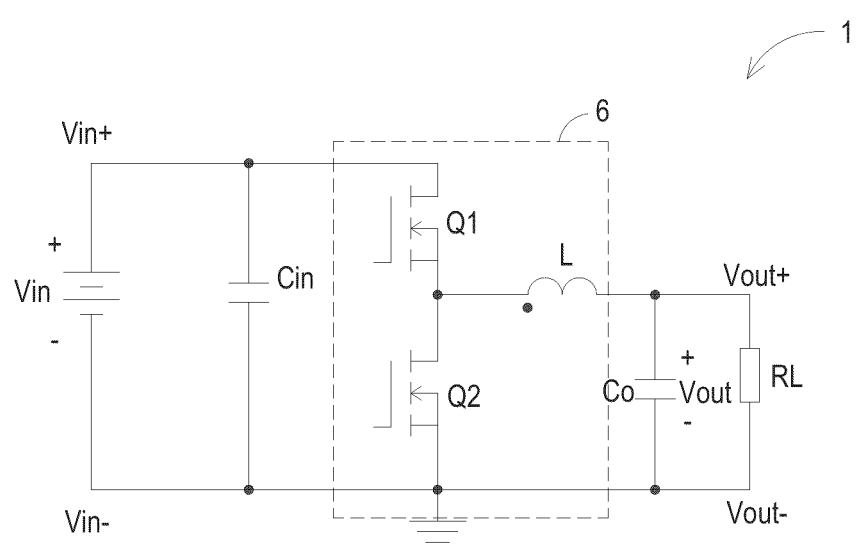
FIG. 4 is an equivalent circuit diagram of the power supply system shown in FIG. 1.

Referring to FIGS. 1 to 4, FIG. 1 is a schematic cross-sectional structure diagram of a power supply system according to a first embodiment of the disclosure; FIG. 2 is a schematic diagram of an exploded structure of the power supply system shown in FIG. 1; FIGS. 3A and 3B are schematic structural diagrams of a substrate of the power supply system shown in FIG. 1 from two different viewing angles; and FIG. 4 is an equivalent circuit diagram of the power supply system shown in FIG. 1, wherein FIG. 4 only schematically shows a power supply circuit of a single-phase power unit, and the power unit in the actual power supply system may include a parallel structure of a plurality of circuits shown in the dashed box of FIG. 4 to output the power required by a load RL. Of course, two or more phases of circuit in the dashed box corresponding to one power unit can be connected in parallel and there is no limitation here. The power supply system 1 of this embodiment is configured to receive and convert the input voltage Vin, so as to supply power to the load RL, wherein the load RL is a processor chip, such as a Central Processing Unit (CPU), a Graphics Processing Unit (GPU), a Tensor Processing Unit (TPU), a Network Processing Unit (NPU), a Field Programmable Gate Array (FPGA), or an Application Specific Integrated Circuit (ASIC). The power supply system 1 shown in FIG. 1 may include one or more power units, and may form a plurality of circuit structures shown in FIG. 4, wherein the output terminals of the multiple power units are connected in parallel to supply power to the load RL together. The power supply system 1 composed of a single single-phase power unit is described below. As shown in FIG. 4, the power supply system 1 includes an input capacitor Cin, two switching elements Q1, Q2, an inductor L and an output capacitor Co, wherein two switching elements Q1, Q2 and the inductor L constitute the power unit 6 of the power supply system 1 to convert electric energy provided by the input voltage Vin. The power unit 6 of the power supply system 1 may be a BUCK circuit or an LLC circuit. The input capacitor Cin is connected to the input voltage Vin to receive electric energy provided by the input voltage Vin, and two terminals of the input capacitor Cin are respectively connected to a positive input terminal Vin+ and a negative input terminal Vin− of the power supply system 1. The two switching elements Q1 and Q2 are connected in series with each other, and a circuit branch formed by the series connected two switching elements Q1 and Q2 is connected in parallel with the input capacitor Cin. A first terminal of the inductor L is connected to a midpoint of the two switching elements Q1 and Q2, and a second terminal of the inductor L is connected to the output capacitor Co. Two terminals of the output capacitor Co are respectively connected to a positive output terminal Vout+ and a negative output terminal Vout− of the power supply system 1, and the output capacitor Co is connected in parallel with the load RL. The negative input terminal Vin− and the negative output terminal Vout− of the power supply system 1 are shorted connection.

As shown in FIGS. 1 to 3B, the physical structure of the power supply system 1 of this embodiment includes a system board 2, a substrate 3, a plurality of output capacitors 4, a plurality of positive output conductive-connected regions 51, a plurality of negative output conductive-connected regions 52, a plurality of positive input conductive-connected regions 53, a plurality of negative input conductive-connected regions 54 and a plurality of power units 6. First, as shown in FIG. 1 and FIG. 2, the system board 2 includes a first side 21 and a second side 22. The first side 21 and the second side 22 of the system board 2 are disposed opposite to each other, and the load RL is disposed on the first side 21 of the system board 2. As shown in FIG. 2, FIG. 3A and FIG. 3B, the substrate 3 includes a first side 31, a second side 32, a plurality of first accommodating grooves 331, a first sidewall 34, a second sidewall 35, and a third sidewall 36 and the fourth sidewall 37. The first side 31 and the second side 32 of the substrate 3 are disposed opposite to each other, and the first side 31 of the substrate 3 is surface-mounted to the second side 22 of the system board 2, so that the first side 31 of the substrate 3 is located between the second side 22 of the system board 2 and the second side 32 of the substrate 3, wherein a setting position that the substrate 3 is located on the system board 2 corresponds to a setting position that the load RL is located on the system board 2. The load RL, the system board 2 and the substrate 3 are overlapped vertically. The plurality of first accommodating grooves 331 are formed by concaving first side 31 of the substrate 3. When the first side 31 of the substrate 3 is surface-mounted to the second side 21 of the system board 2, each of the first accommodating grooves 331 and the second side 22 of the system board 2 respectively define an accommodating space in a closed state, wherein each of the first accommodating grooves 331 can be, but is not limited to, machined by a groove milling process. The first sidewall 34, the second sidewall 35, the third sidewall 36 and the fourth sidewall 37 of the substrate 3 are all located between the first side 31 and the second side 32 of the substrate 3, wherein the first sidewall 34 and the second sidewall 35 are disposed opposite to each other, and the third sidewall 36 and the fourth sidewall 37 are disposed opposite to each other and located between the first sidewall 34 and the second sidewall 35.

As shown in FIG. 1, each of output capacitors 4 is used to form the output capacitor Co in the corresponding power supply system 1 as shown in FIG. 4, and the output capacitor 4 is surface-mounted on the second side 22 of the system board 2 by a welding process, and is electrically connected to the load RL via the wiring in the system board 2. Each of output capacitors 4 is accommodated in the corresponding first accommodating groove 331 on the substrate 3, and the volume of each of the first accommodating grooves 331 is larger than the volume of the corresponding output capacitor 4, and there is a gap between a wall surface of each of the first accommodating grooves 331 and the corresponding output capacitor 4, so that the output capacitor 4 does not contact the wall surface of the corresponding first accommodating groove 331, so as to improve the stability of the output capacitor 4 mounted on the system board 2.

Each of positive output conductive-connected region 51 is used to form the positive output terminal Vout+ in the power supply system 1 shown in FIG. 4 and is arranged on the first side 31 of substrate 3 in sequence. When the first side 31 of substrate 3 is surface-mounted to the second side 22 of system board 2, each of positive output conductive-connected regions 51 is connected to the second side 22 of system board 2. An extension direction of each of positive output conductive-connected regions 51 is the same as the direction of the first sidewall 34 of the substrate 3 pointing to the second sidewall 35, and each of positive output conductive-connected regions 51 is electrically connected to one terminal of the corresponding output capacitor 4 via the wiring in the system board 2, wherein the plurality of positive output conductive-connected regions 51 are connected to each other via the wiring in the substrate 3 to form the positive output terminal Vout+ of the entire power supply system 1. Each of negative output conductive-connected regions 52 is used to form the negative output terminal Vout− in the power supply system 1 shown in FIG. 4 and is arranged on the first side 31 of substrate 3 in sequence. When the first side 31 of substrate 3 is surface-mounted to the second side 22 of system board 2, each of negative output conductive-connected regions 52 is connected to the second side 22 of system board 2. An extension direction of each of negative output conductive-connected regions 52 is the same as the direction of the first sidewall 34 of the substrate 3 pointing to the second sidewall 35, and each of negative output conductive-connected regions 52 is electrically connected to the other terminal of the corresponding output capacitor 4 via the wiring in the system board 2, wherein the plurality of negative output conductive-connected regions 52 are connected to each other via the wiring in the substrate 3 to form the negative output terminal Vout− of the entire power supply system 1. As shown in FIG. 3A and FIG. 3B, the plurality of negative output conductive-connected regions 52 and the plurality of positive output conductive-connected regions 51 are interleaved with each other, which means that there is a corresponding positive output conductive-connected region 51 between every two adjacent negative output conductive-connected regions 52 and there is a corresponding negative output conductive-connected region 52 between every two adjacent positive output conductive-connected regions 51. In this embodiment, each of the first accommodating grooves 331 is located between a corresponding positive output conductive-connected region 51 and a corresponding negative output conductive-connected region 52, so that the output capacitor 4 located in the corresponding first accommodating groove 331 is located between the corresponding positive output conductive-connected region 51 and the corresponding negative output conductive-connected region 52.

In the above-mentioned embodiment, as shown in FIG. 2, the power unit 6 includes at least one positive output terminal 601 and at least one negative output terminal 602. The positive output terminal 601 of the power unit 6 is electrically connected to the corresponding positive output conductive-connected regions 51 via the wiring in the substrate 3, and is electrically connected to one terminal of the output capacitor Co via the wiring in the system board 2. The negative output terminal 602 of the power unit 6 is electrically connected to the corresponding negative output conductive-connected region 52 via the wiring in the substrate 3, and is electrically connected to the other terminal of the output capacitor Co via the wiring in the system board 2.

FIG. 3C shows another possible terminal arrangement form. As shown in FIG. 3C, since the current of the positive output conductive-connected region 51 is larger than that of the negative output conductive-connected region 52, the size of the positive output conductive-connected region 51 will be set wider or set as two parallel positive output conductive-connected regions 51 adjacent to each other, to successively form an arrangement form of a positive output conductive-connected region 51, a positive output conductive-connected region 51, a negative output conductive-connected region 52, a positive output conductive-connected region 51, and a positive output conductive-connected region 51, a negative output conductive-connected region 52, a positive output conductive-connected region 51, a positive output conductive-connected region 51 and a negative output conductive-connected region 52 in sequence, that is, there are two corresponding positive output conductive-connected regions 51 between every two adjacent negative output conductive-connected regions 52. The parallel positive output conductive-connected region 51 (i.e., two corresponding positive output conductive-connected regions 51) can be formed by blocking with a green oil stick on a very wide positive output conductive-connected region 51, as shown by the dotted line in FIG. 3C. It can also be formed by two independent positive output conductive-connected regions 51, and this kind of arrangement is beneficial to the exhaust gas during the welding process between the substrate and the system board and reducing the void ratio.

In addition to the arrangement form shown in FIG. 3C, the arrangement form of the terminals can also has other arrangements. As shown in FIG. 3D, there are two corresponding negative output conductive-connected regions 52 between every two adjacent positive output conductive-connected regions 51. That is, successively forming an arrangement form of a positive output conductive-connected region 51, a negative output conductive-connected region 52, a negative output conductive-connected region 52, a positive output conductive-connected region 51, a negative output conductive-connected region 52 and a negative output conductive-connected region 52 in sequence. In other embodiments, there is a corresponding negative output conductive-connected region 52 between two adjacent positive output conductive-connected regions 51, and the number of negative output conductive-connected regions 52 may be greater than two. As shown in FIG. 3E, two positive output conductive-connected regions 51 or two negative output conductive-connected regions 52 are included between every two adjacent first accommodating grooves 331, that is successively forming an arrangement form of a positive output conductive-connected region 51, a positive output conductive-connected region 51, a negative output conductive-connected region 52, a negative output conductive-connected region 52, a positive output conductive-connected region 51, a positive output conductive-connected region 51, a negative output conductive-connected region 52, and a negative output conductive-connected region 52 in sequence. As shown in FIG. 3F, a plurality of positive output conductive-connected regions 51 or a plurality of negative output conductive-connected regions 52 are included between every two adjacent first accommodating grooves 331. After dividing a large pad into small pads, the exhaust passage of the welding process can be increased, making the welding more stable and reducing the void rate. It should be noted that, in these embodiments, the numbers of the positive output conductive-connected regions 51 and the negative output conductive-connected regions 52 at each place may be other values, such as more than two.

The second side 22 of the system board 2 is used for connecting to the substrate 3, and its pads can be set as a structure that is completely consistent with the pads of the substrate 3. The first side 21 of the system board 2 is used for connecting with the load RL, and its pads can be set as a structure that is completely consistent with the pads of the load RL. Alternatively, in order to satisfy better uniform current flow between the power unit and the load, the second side 22 of the system board 2 can also be set to the same pad layout as the first side 21 of the system board 2, that is, the pad layouts of the first side 21 of the system board 2, the second side 22 of the system board 2, and the first side 31 of the substrate 3 are exactly the same. According to the actual processing process, the relative position between the substrate 3 and the system board 2 may be offset, and the effective welding area must be at least 50% larger than the pad area to ensure welding reliability and current flowing requirements.

Referring to FIGS. 3D to 3F, it can be seen that the polarities of the output conductive-connected regions adjacent to both sides of each output capacitor 4 are different. Two output conductive-connected regions are included between every two adjacent output capacitor 4 along a first direction 51, and the polarities of the two output conductive-connected regions are the same. As shown in FIG. 3G, along the first direction 51, three output conductive-connected regions may also be included between every two adjacent output capacitors 4, wherein the polarities of the output conductive-connected regions adjacent to the two adjacent output capacitors are different. As shown in FIG. 3F, along a second direction S2, the polarities of the same side of adjacent output capacitors 4 are the same. In this embodiment, by setting a plurality of output conductive-connected regions, the current flow capacity is greatly improved, and the power supply efficiency of the power module 6 is further improved. Taking a first column of capacitors on the far left of FIG. 3F as an example, each capacitor includes two end faces, and the same side of the output capacitor 4 refers to a side corresponding to the same end faces of the array of the output capacitors 4 along the second direction, such as, a left side or a right side of output capacitors 4 in FIG. 3F. It should be noted that, in this embodiment, the first direction 51 is an arrangement direction of the first accommodating grooves 331, such as the horizontal direction, and the second direction S2 is an extending direction of the first accommodating grooves 331, such as the longitudinal direction. The second direction S2 is perpendicular to the first direction S1.

Each of the positive input conductive-connected regions 53 is used to form the positive input terminal Vin+ in the power supply system 1 shown in FIG. 4. As shown in FIGS. 2, 3A and 3B, the number of the positive input conductive-connected regions 53 is two, and the two positive input conductive-connected regions 53 are disposed on the first side 31 of the substrate 3 and are respectively adjacent to a first sidewall 34 and a second sidewall 35 of the substrate 3. In these embodiments, a plurality of positive output conductive-connected regions 51 and the plurality of negative output conductive-connected regions 52 are respectively located between the two positive input conductive-connected regions 53, wherein the two positive input conductive-connected regions 53 are connected to each other via the wiring in the substrate 3 to constitute the positive input terminal Vin+ of the entire power supply system 1.

Each of the negative input conductive-connected regions 54 is used to form the negative input terminal Vin− in the power supply system 1 shown in FIG. 4. As shown in FIGS. 2, 3A and 3B, the number of the negative input conductive-connected regions 54 is two, and the two negative input conductive-connected regions 54 are disposed on the first side 31 of the substrate 3 and are respectively adjacent to a third sidewall 36 and a four sidewall 37 of the substrate 3. In these embodiments, a plurality of positive output conductive-connected regions 51 and the plurality of negative output conductive-connected regions 52 are respectively located between the two negative input conductive-connected regions 54, wherein the two negative input conductive-connected regions 54 are connected to each other via the wiring in the substrate 3 to constitute the negative input terminal Vin− of the entire power supply system 1. In some embodiments, since the negative input terminal Vin− of the power supply system 1 and the negative output terminal Vout− of the power supply system 1 are shorted connection, a setting position of the negative input conductive-connected region 54 constituting the negative input terminal Vin− of the power supply system 1 and a setting position of the negative output conductive-connected region 52 constituting the negative output terminal Vout− of the power supply system 1 can be exchanged with each other. In this embodiment, the positive output conductive-connected region 51, the negative output conductive-connected region 52, the positive input conductive-connected region 53, and the negative input conductive-connected region 54 may be constituted by, but are not limited to, Solder Mask Defined Pads (SMD) or Non-Solder Mask Defined Pads (NSMD).

As shown in FIG. 1 and FIG. 2, a plurality of power units 6 are disposed on the second side 32 of the substrate 3, and each of the power units 6 is connected to the corresponding positive output conductive-connected region 51, the negative output conductive-connected region 52, the positive input conductive-connected region 53 and the negative input conductive-connected region 54 via the wiring in the substrate 3.

It can be seen from the above that the output capacitor 4 of the power supply system 1 of this embodiment is surface-mounted on the second side 22 of the system board 2, and the load RL is disposed on the first side 21 of the system board 2, so that the connection path between the output capacitor 4 and the load RL is very short. That is, the connection path between the output capacitor 4 and the load RL is only the wiring in the system board 2 connected between the output capacitor 4 and the load RL, while the connection impedance between the output capacitor 4 and the load RL is also low, which improves the power supply performance of the power unit 6, thus the overall performance of the power supply system 1 of this embodiment is also improved accordingly. In addition, since each output capacitor 4 is disposed in the corresponding first accommodating groove 331 on the substrate 3, and the output capacitor 4 is located between the corresponding positive output conductive-connected region 51 and the corresponding negative output conductive-connected region 52, it means that the current on the output capacitor Co shown in FIG. 4 can evenly flow to the positive output terminal Vout+ and the negative output terminal Vout−, so that the current equalization effect between the positive output conductive-connected region 51 constituting the positive output terminal Vout+ and the negative output conductive-connected region 52 constituting the negative output terminal Vout− is very significant. Finally, the process is simple and reliable, since the output capacitors Co are all disposed on the system board 2 by using a conventional surface mount process.

Figure 5:
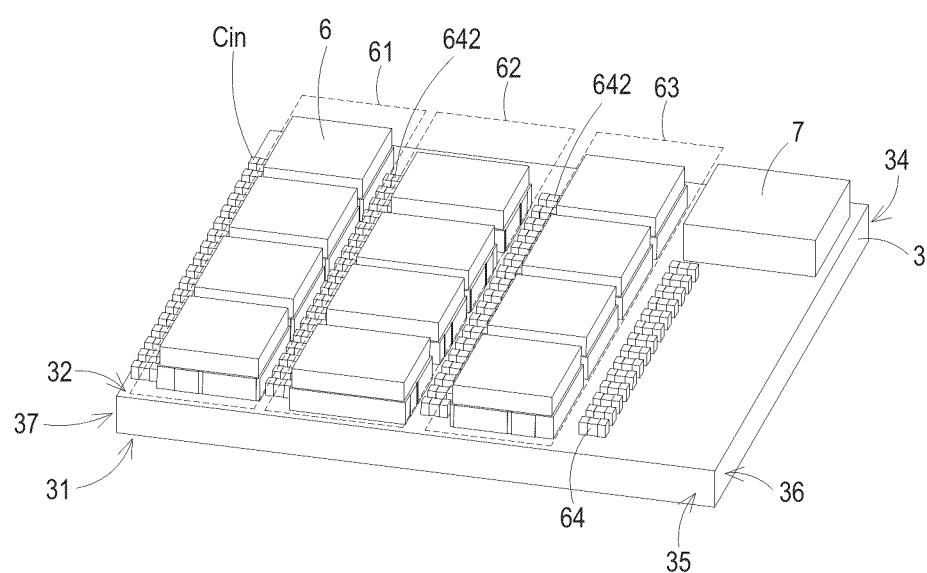
FIG. 5 is a schematic structural diagram of the substrate of the power supply system shown in FIG. 1 and electronic components disposed on the substrate.

Referring to FIG. 5 in conjunction with FIG. 2 and FIG. 3A, FIG. 5 is a schematic structural diagram of the substrate of the power supply system shown in FIG. 1 and the electronic components disposed on the substrate. In this embodiment, the power supply system 1 further includes a controller 7, which is disposed on the second side 32 of the substrate 3 and is adjacent to some of the power units 6, and further adjacent to a junction of the first sidewall 34 and the third sidewall 36 of the substrate 3. The controller 7 is electrically connected to the plurality of power units 6 via the wiring in the substrate 3, and used to control operation states of the switching elements (not shown) in the power units 6. It can be seen from the above that the controller 7 and the power unit 6 of the power supply system 1 of the present embodiment are both disposed on the second side 32 of the substrate 3, so no additional connection line is required between the controller 7 and the power unit 6, so that the connection impedance between the controller 7 and the power unit 6 is greatly reduced, which also reduces the time that the control signal output by the controller 7 transmits to the power unit 6, thereby maintaining the stability of the output voltage of the power supply system 1. In addition, since the controller 7 is disposed on the second side 32 of the substrate 3, the number of electronic elements on the system board 2 can be reduced, so that the area of the system board 2 can be reduced.

Continuing to refer to FIG. 5, in this embodiment, the number of the power units 6 is twelve, and the arrangement of the twelve power units 6 forms three arrangement rows, namely a first arrangement row 61, a second arrangement row 62 and a third arrangement row 63. The first arrangement row 61, the second arrangement row 62 and the third arrangement row 63 are arranged in sequence, and the arrangement direction between the first arrangement row 61, the second arrangement row 62 and the third arrangement row 63 is the same as the direction of the fourth sidewall 37 of the substrate 3 pointing to the third sidewall 36, and each of the first arrangement row 61, the second arrangement row 62 and the third arrangement row 63 includes four power units 6.

In some embodiments, the power unit 6 can package the two switching elements Q1, Q2 and the inductor L shown in FIG. 4 into a single structure, and at the same time, a part of the input capacitors Cin in the power supply system can be integrated into the single structure, and the other part of the input capacitor Cin can be disposed on the second side of the substrate. A plurality of input capacitors Cin are disposed on the second side 32 of the substrate 3, and are sequentially arranged between the first sidewall 34 and the second sidewall 35 of the substrate 3, and the plurality of input capacitors Cin and a plurality of power units 6 are interleaved with each other. As can be seen from the above, the power unit 6 and the input capacitor Cin of the power supply system 1 of the present embodiment are both disposed on the second side 32 of the substrate 3, so no additional connection wire is required between the power unit 6 and the input capacitor Cin, so that the connection impedance between the power unit 6 and the input capacitor Cin is greatly reduced, and the voltage on the input capacitor Cin is not easily attenuated, and after filtering by the input capacitor Cin, the voltage fluctuation of the electric energy is not easily to have impact on the power unit 6. Therefore, the input voltage of the power unit 6 is relatively stable, and since the input capacitor Cin is disposed on the second side 32 of the substrate 3, the number of electronic elements on the system board 2 can be reduced, and the area of the system board 2 can be further reduced. In other embodiments, in order to reduce the volume of the power unit 6, all the input capacitors Cin may be disposed on the second side of the substrate, and only the two switching elements Q1, Q2 and the inductor L shown in FIG. 4 are packaged as an integrally formed single structure, instead of integrating the input capacitors Cin inside the power unit 6.

Figure 6:
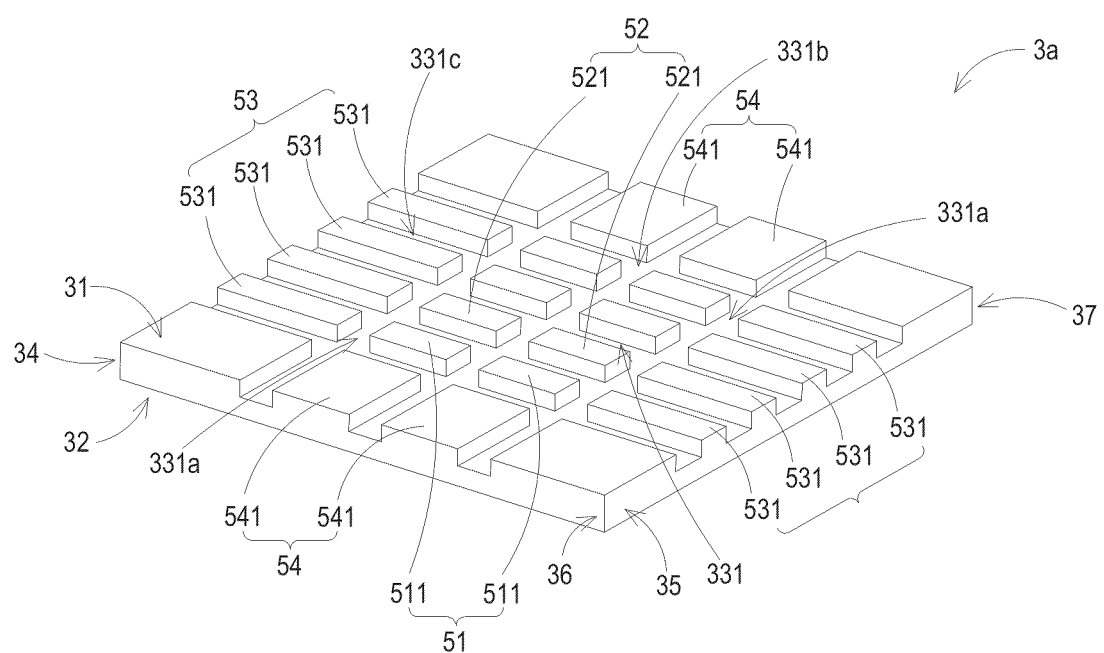
FIG. 6 is a schematic structural diagram of another embodiment of the substrate of the power supply system shown in FIG. 1.

In some embodiments, in order to improve the power supply performance of the power unit 6, the number of the output capacitors 4 needs to be greatly increased, and the number of the accommodating grooves of the substrate also needs to be increased accordingly to accommodate a corresponding number of output capacitors 4. Referring to FIG. 6 in conjunction with FIG. 1, FIG. 6 is a schematic structural diagram of another embodiment of the substrate of the power supply system shown in FIG. 1. As shown in FIG. 6, in addition to the first accommodating grooves 331, the substrate 3*a* of this embodiment also includes a plurality of second accommodating grooves 331*a*, a plurality of third accommodating grooves 331*b* and a plurality of fourth accommodating grooves 331*c*. The plurality of second accommodating grooves 331*a* are formed by concaving the first side 31 of the substrate 3*a*, and run through the third sidewall 36 and the fourth sidewall 37 of the substrate 3*a*, wherein a part of the second accommodating grooves 331*a* are located between the positive output conductive-connected region 51 and the positive input conductive-connected region 53, and the other part of the second accommodating grooves 331*a* are located between the negative output conductive-connected region 52 and the positive input conductive-connected region 53, wherein a plurality of second accommodating grooves 331*a* are used to accommodate additionally increased output capacitors 4.

The plurality of third accommodating grooves 331*b* are formed by concaving the first side 31 of the substrate 3*a*, and runs through the third sidewall 36 and the fourth sidewall 37 of the substrate 3*a*, and some of the third accommodating grooves 331*b* divide the positive output conductive-connected region 51 into a plurality of sub-positive output conductive-connected regions 511, for example, two sub-positive output conductive-connected regions 511. The two sub-positive output conductive-connected regions 511 of each positive output conductive-connected region 51 are arranged in sequence and are spaced apart from each other, and the arrangement direction of the two sub-positive output conductive-connected regions 511 is the same as the direction of the first sidewall 34 of the substrate 3 pointing to the second sidewall 35. The other part of the third accommodating grooves 331*b* divide the negative output conductive-connected region 52 into a plurality of sub-negative output conductive-connected regions 521, for example, two sub-negative output conductive-connected regions 521. The two sub-negative output conductive-connected regions 521 of each negative output conductive-connected region 52 are arranged in sequence and are spaced apart from each other, and the arrangement direction of the two sub-negative output conductive-connected regions 521 is the same as the direction of the first sidewall 34 of the substrate 3 pointing to the second sidewall 35, wherein a plurality of third accommodating grooves 331*b* are used to accommodate additional increased output capacitors 4. The other part of the third accommodating grooves 331*b* divide the negative input conductive-connected region 54 into a plurality of sub-negative input conductive-connected regions 541, for example, two sub-negative input conductive-connected regions 541. The two sub-negative input conductive-connected regions 541 of each negative input conductive-connected region 54 are arranged in sequence and spaced apart, and the arrangement direction of the two sub-negative input conductive-connected regions 541 is the same as the direction of the first sidewall 34 of the substrate 3 pointing to the second sidewall 35, wherein a plurality of third accommodating grooves 331*b* are used to accommodate additional increased output capacitors 4.

The plurality of fourth accommodating grooves 331*c* are formed by concaving the first side 31 of the substrate 3*a*, and each of the fourth accommodating groove 331*c* communicates with the corresponding first accommodating groove 331, wherein the fourth accommodating groove 331*c* divides the positive input conductive-connected region 53 into a plurality of sub-positive input conductive-connected regions 531, for example, four sub-positive input conductive-connected regions 531. The four sub-positive input conductive-connected regions 531 of each positive input conductive-connected region 53 are arranged in sequence and are spaced apart from each other, and the arrangement direction of the four sub-positive input conductive-connected regions 531 is the same as the direction of the third sidewall 36 of the substrate 3 pointing to the fourth sidewall 37, wherein the plurality of fourth accommodating grooves 331*c* are used to accommodate additional increased output capacitors 4.

Figure 7:
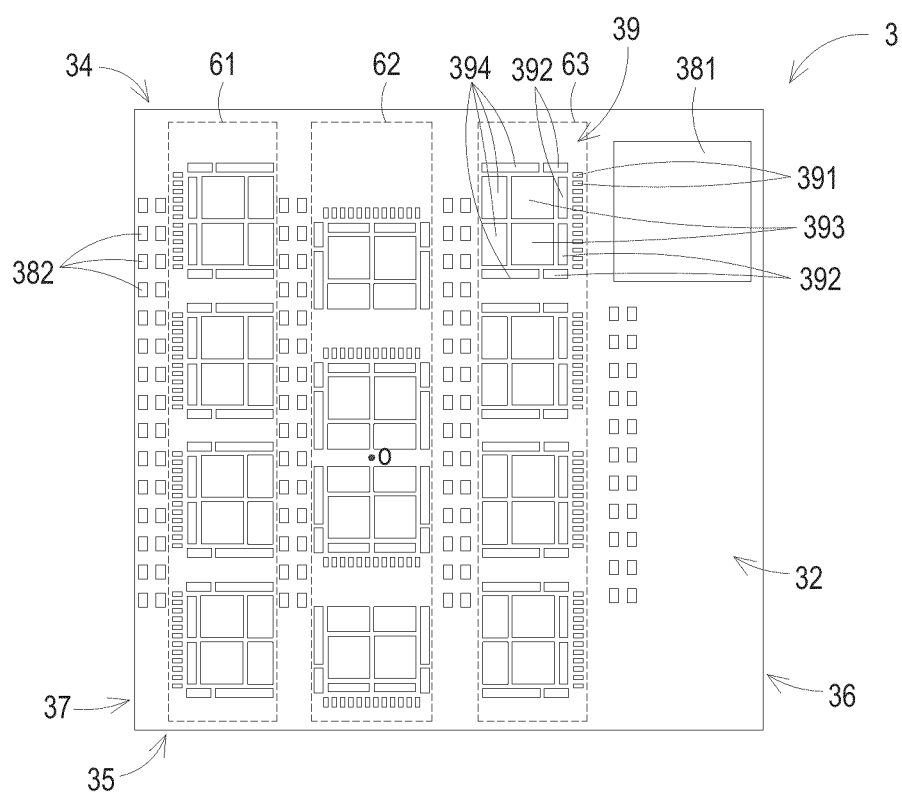
FIG. 7 is a top view of the structure of a second side of the substrate of the power supply system shown in FIG. 1.

Referring to FIG. 7 in conjunction with FIGS. 1 and 2, FIG. 7 is a top view of the structure of the second side of the substrate of the power supply system shown in FIG. 1. As shown in FIG. 7, the second side 32 of the substrate 3 includes a controller pad 381, a plurality of input capacitor pads 382 and a plurality of power unit pads 39. The controller pad 381 is adjacent to the junction of the first sidewall 34 and the third sidewall 36 of the substrate 3, and is used to dispose the controller 7, for example, by welding, so that the controller 7 is disposed on the second side 32 and is electrically coupled to the substrate 3 via the controller pad 381, and the control signal output by the controller 7 can be transmitted to the wiring in the substrate 3 via the controller pad 381.

The plurality of power unit pads 39 on the substrate 3 constitute three arrangement rows, and setting positions of the three arrangement rows constituted by the plurality of power unit pads 39 on the substrate 3 correspond to setting positions of the three arrangement rows constituted by the power units 6 set on the substrate 3, so the first arrangement row 61, the second arrangement row 62 and the third arrangement row 63 in FIG. 7 are also be used to represent three arrangement rows formed by the plurality of power unit pads 39 on the substrate 3, and the setting method of the three arrangement rows will not be repeated here. Each of the power unit pads 39 is used to dispose the corresponding power unit 6, for example, by welding, so that the power unit 6 is disposed on the second side 32 and is electrically coupled to the substrate 3 via the corresponding power unit pad 39. The electrical energy output by the power unit 6 can be transmitted to the wiring in the substrate 3 via the power unit pads 39.

In this embodiment, each of the power unit pads 39 includes a plurality of signal terminals 391, and each of the signal terminals 391 is electrically coupled to the controller 7 via the wiring in the substrate 3. When the power unit 6 is disposed on the corresponding power unit pad 39, the control signal output by the controller 7 is transmitted to the power unit 6 via the corresponding signal terminal 391, wherein the plurality of signal terminals 391 of each power unit pad 39 are set on one sideline relatively far from a center point O of the substrate 3 among four sidelines of the corresponding power unit pad 39. Taking FIG. 7 as an example, the center point O of the substrate 3 is preset as a center position of the three arrangement rows constructed by a plurality of power unit pads 39 on the substrate 3. Furthermore, in this embodiment, the center point O of the substrate 3 is located between the second power unit 6 and the third power unit 6 of the second arrangement row 62. The signal terminals 391 of the four power unit pads 39 in the first arrangement row 61 are all located on one sideline relatively far from the center point O of the substrate 3 among the four sidelines of the corresponding power unit pad 39, that is, one sideline adjacent to the fourth sidewall 37 of the substrate 3 among the four sidelines of the power unit pad 39. The signal terminals 391 of the two power unit pads 39 adjacent to the first sidewall 34 of the substrate 3 in the second arrangement row 62 are all located in one sideline relatively far away from the center point O of the substrate among four sidelines of the corresponding power unit pad 39, that is, located in one sideline adjacent to the first sidewall 34 of the substrate 3 among four sidelines of the power unit pad 39. The signal terminals 391 of the two power unit pads 39 adjacent to the second sidewall 35 of the substrate 3 in the second arrangement row 62 are all located in one sideline relatively far away from the center point O of the substrate 3 among four sidelines of the corresponding power unit pad 39, that is, located in one sideline adjacent to the second sidewall 35 of the substrate 3 among four sidelines of the power unit pad 39. The signal terminals 391 of the four power unit pads 39 in the third arrangement row 63 are all located in one sideline relatively far away from the center point O of the substrate 3 among four sidelines of the corresponding power unit pad 39, that is, located in one sideline adjacent to the third sidewall 36 of the substrate 3 among four sidelines of the power unit pad 39. The above setting position of the signal terminals 391 of the power unit pad 39 can make the wiring arrangement inside the substrate 3 more flexible.

Of course, each of the power unit pads 39 also includes more types of terminals, such as an input terminal 392, an output terminal 393, and a ground terminal 394, and so on. Among them, the signal terminal 391, the input terminal 392, the output terminal 392, and the ground terminal 394 may be constituted by, but not limited to, a Solder Mask Defined Pad (SMD) or a Non-Solder Mask Defined Pad (SMD). The setting of the input terminal 392, the output terminal 393 and the ground terminal 394 will be described in detail later.

The plurality of input capacitor pads 382 are sequentially arranged between the third sidewall 36 and the fourth sidewall 37 of the substrate 3 in the form of four arrangement rows. The four arrangement rows formed by the plurality of input capacitor pads 381 are interleaved with the three arrangement rows formed by the plurality of power unit pads 39, that is, one arrangement row formed by the corresponding power unit pads 39 is located between every two adjacent arrangement rows of the plurality of input capacitor pads 381. The plurality of input capacitor pads 382 in each of the arrangement rows are arranged in sequence; and the arrangement direction is the same as the direction of the first sidewall 34 of the substrate 3 pointing to the second sidewall 35. Each input capacitor pad 382 is in contact with a corresponding input capacitor Cin, so that the input capacitors Cin are electrically coupled to the substrate 3 via the corresponding input capacitor pad 382, thereby performing power transfer between the substrate 3 and the input capacitors Cin.

Figure 8:
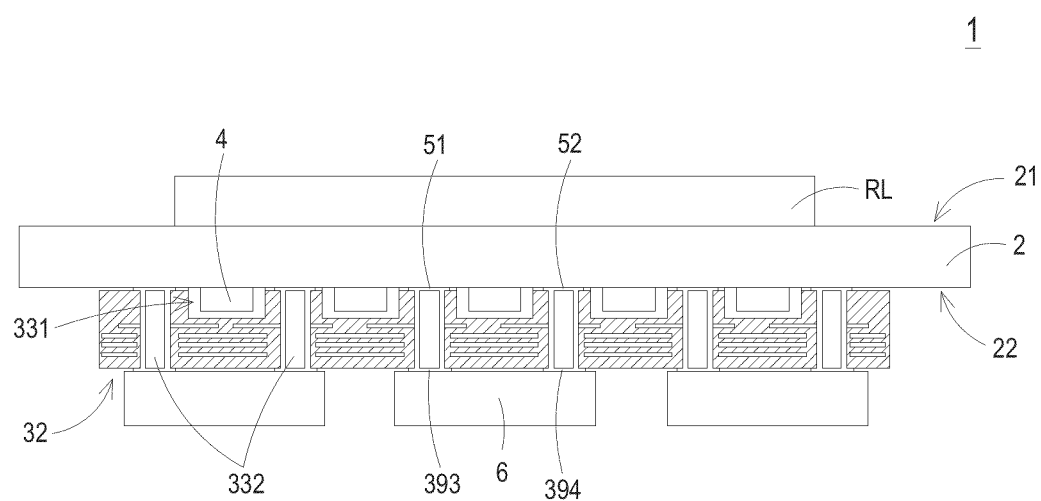
FIG. 8 is a schematic cross-sectional structural diagram showing a connection hole of the power supply system shown in FIG. 1.

In some embodiments, the interconnection between the various conductive-connected regions located on the first side 31 of the substrate 3 and the various terminals of the power unit pads 39 located on the second side 32 of the substrate 3 can be implemented in various ways, for example, a connection hole is provided in the substrate 3 for electrical connection. Referring to FIG. 8 in conjunction with FIG. 1, FIG. 2 and FIG. 7, FIG. 8 is a schematic cross-sectional structural diagram showing the connection hole of the power supply system shown in FIG. 1. As shown in FIG. 8, the substrate 3 further includes a plurality of connection holes 332, each connection hole 332 runs through the first side 31 and the second side 32 of the substrate 3, and each connection hole 332 can be a through hole structure with a conductive function or a blind buried hole structure. The setting position of one terminal of the connection hole 332 corresponds to the input terminal 392, the output terminal 393 or the ground terminal 394 of the power unit pad 39, and the setting position of the other terminal of the connection hole 332 corresponds to the positive input conductive-connected region 53, the positive output conductive-connected region 51, the negative output conductive-connected region 52 or the negative input conductive-connected region 54. The input terminal 392 of each power unit pad 39 is connected to the positive input conductive-connected region 53 via the corresponding connection hole 332, and the positive input terminal of the power unit 6 receives the electric energy from the system board 2 via the input terminal 392 of the power unit pad 39 on the substrate 3, the corresponding connection hole 332 and the positive input conductive-connected region 53. The output terminal 393 of each power unit pad 39 is connected to the positive output conductive-connected region 51 via the corresponding connection hole 332, and the electric energy of the positive output terminal of the power unit 6 is transmitted to the system board 2 via the output terminal 393 of the power unit pad 39 on the substrate 3, the corresponding connection hole 332 and the positive output conductive-connected region 51. The ground terminal 394 of each power unit pad 39 is connected to the negative output conductive-connected region 52 or the negative input conductive-connected region 54 via the corresponding connection hole 332, and the electric energy of the negative output terminal of the power unit 6 is transmitted to the system board 2 via the ground terminal 394 of the power unit pad 39 on the substrate 3, the corresponding connection hole 332 and the negative output conductive-connected region 52, and the electric energy of the negative input terminal of the power unit 6 is transmitted to the system board 2 via the ground terminal 394 of the power unit pad 39 on the substrate 3, the corresponding connection hole 332 and the negative input conductive-connected region 54. FIG. 8 only shows the example that the output terminal 393 is connected to the positive output conductive-connected region 51 via the corresponding connection hole 332, and the ground terminal 394 of the power unit pad 39 is connected to the negative output conductive-connected region 52 via the corresponding connection hole 332, and another example that the input terminal 392 is connected to the positive input conductive-connected region 53 via the corresponding connection hole 332, and the ground terminal 394 is connected to the negative input conductive-connected region 54 via the corresponding connecting hole 332 can also be connected in a similar manner, and this will not be described. As can be seen from the above, since the substrate 3 is located between the power unit 6 and the system board 2, the input power received on the system board 2 can be directly transmitted to the power unit 6 via the connection holes 332 in the substrate 3, and the power unit 6 will convert the input energy and then transmit it to the system board 2 via the connection holes 332 in the substrate 3. Since the output capacitor 4 is directly surface-mounted to the second side 22 of the system board 2, the converted energy received by the system board 2 can be directly transmitted to the output capacitor 4 and the load RL via the wiring in the system board 2. Therefore, it can be seen that the setting method of the power supply system 1 of the present disclosure makes the connection path between the output capacitor 4 and the load RL shorter, and greatly reduces the transmission impedance between the output capacitor 4 and the load RL.

In order to prevent the first side 31 of the substrate 3 from being bent when the first accommodating groove 331 is formed by the groove milling process, which will affect the welding between the substrate 3 and the system board 2, in some embodiments, a raw substrate without the first accommodating groove 331 (hereinafter referred to as the raw substrate 3) is optimized, for example, the density of wiring layers in the raw substrate 3 adjacent to the first side 31 of the raw substrate 3 is increased, and the density of wiring layers in the raw substrate 3 adjacent to the second side 32 of the raw substrate 3 is reduced, so that the stress of a portion of the raw substrate 3 adjacent to the four sidewalls of the raw substrate 3 is relatively smaller, and the stress of the other portion of the raw substrate 3 adjacent to the central position of the raw substrate 3 is relatively larger, thus causing the pre-bending of the raw substrate 3. When the first accommodating groove 331 is set on the first side 31 of the raw substrate 3 by a groove milling process to form the substrate 3, the stress at the center of the substrate 3 can be relieved to ensure the flatness of substrate 3. In other embodiments, when the first accommodating groove 331 is set on the first side 31 of the substrate 3 by a groove milling process, the second side 32 of the substrate 3 is also simultaneously formed with additional grooves by a groove milling process or a drilling method, so that the first side 31 and the second side 32 of the substrate 3 have the same degree of stress release and ensure the flatness of the substrate 3.

Figure 9:
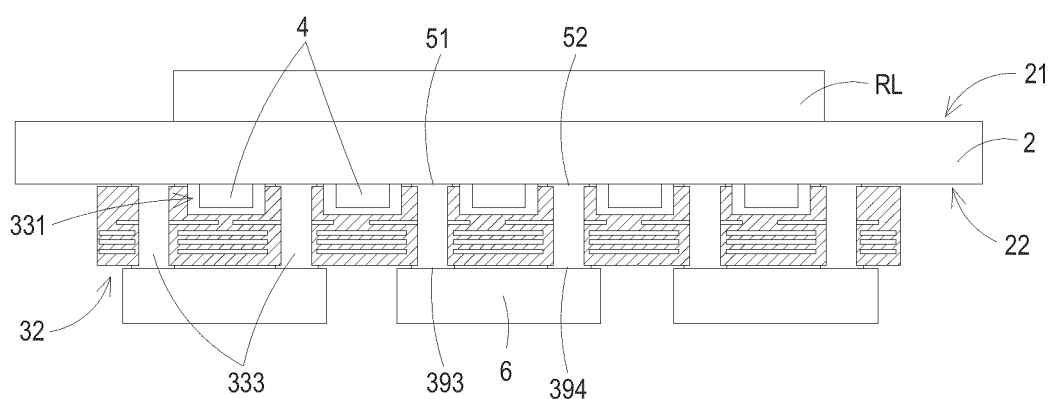
FIG. 9 is a schematic cross-sectional structure diagram of a power supply system according to a second embodiment of the disclosure.

Referring to FIG. 9, which is a schematic cross-sectional structure diagram of a power supply system according to a second embodiment of the present disclosure. The power supply system 1a of the present embodiment is similar to the power supply system 1 shown in FIG. 1, and compared with the power supply system 1 shown in FIG. 1 being connected, using the connection holes, between the conductive-connected regions and the terminals corresponding to the power unit pads 39, the power supply system 1a of this embodiment includes a plurality of copper pillars 333, each of the copper pillars 333 is embedded in the substrate 3, and a setting position of one terminal of the copper pillar 333 corresponds to the input terminal 392, the output terminal 393 or the ground terminal 394 of the power unit pad 39, and a setting position of the other terminal of the copper pillars 333 corresponds to the positive input conductive-connected region 53, the positive output conductive-connected region 51, the negative output conductive-connected region 52 or the negative input conductive-connected region 54. The input terminal 392 of each power unit pad 39 is connected to the positive input conductive-connected region 53 via the corresponding copper pillar 333, and the output terminal 393 of each power unit pad 39 is connected to the positive output conductive-connected region 51 via the corresponding copper pillar 333, and the ground terminal 394 of each power unit pad 39 is connected to the negative output conductive-connected region 52 or the negative input conductive-connected region 54 via the corresponding copper pillar 333. Therefore, the power supply system 1a of the present embodiment can meet the current flow requirement between the corresponding conductive-connected region on the first side 31 of the substrate 3 and the terminals corresponding to the power unit pads 39 on the second side 32 of the substrate 3, and when the current between the corresponding conductive-connected region on the first side 31 of the substrate 3 and the terminals corresponding to the power unit pads 39 on the second side 32 of the substrate 3 is relatively larger, the effective conductive-connected region area achieved by the copper pillars 333 is relatively larger, thus leading to higher stability of current transmission. In addition, since the substrate 3 is located between the system board 2 and the power unit 6, the heat energy generated by the power unit 6 can be conducted to the system board 2 via the copper pillars 333 in the substrate 3, and dissipate heat via the heat sink (not shown) on the system board 2.

Figure 10:
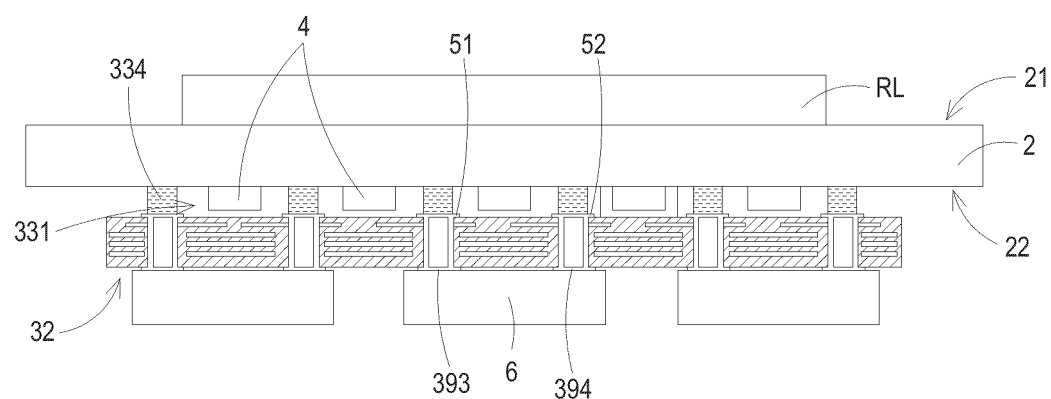
FIG. 10 is a schematic cross-sectional structure diagram of a power supply system according to a third embodiment of the present disclosure.
Figure 11:
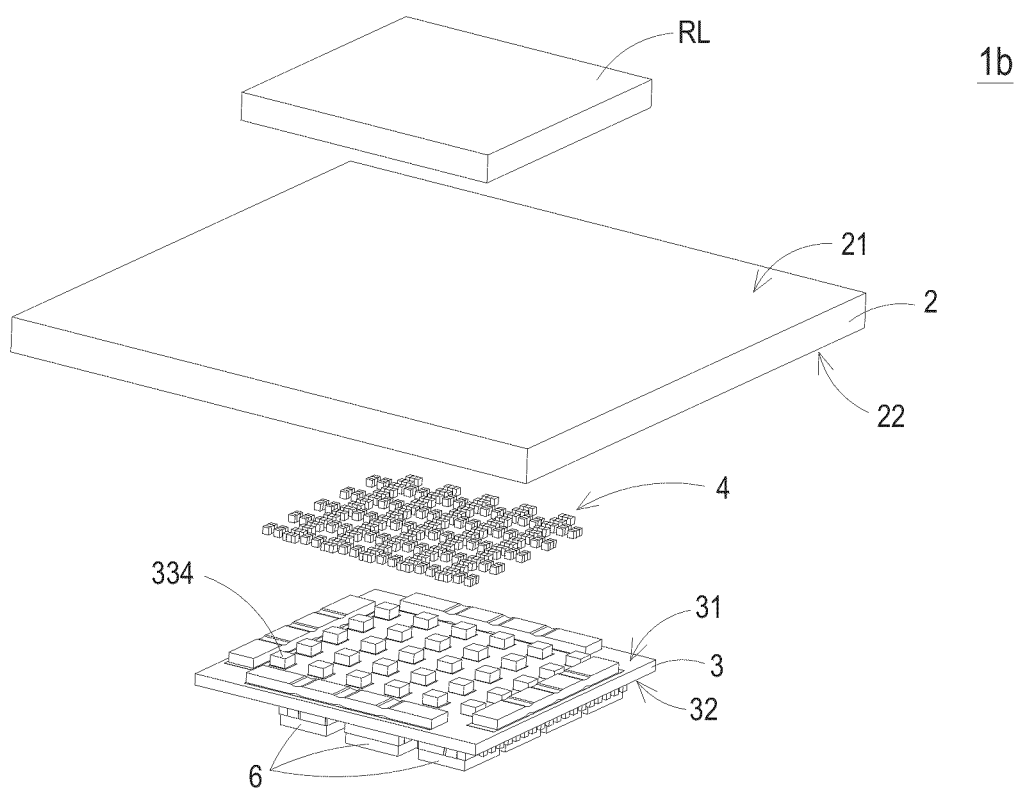
FIG. 11 is a schematic diagram of an exploded structure of the power supply system shown in FIG. 10.

Referring to FIGS. 10 and 11, wherein FIG. 10 is a schematic cross-sectional structure diagram of a power supply system according to a third embodiment of the disclosure and FIG. 11 is a schematic exploded structure diagram of the power supply system shown in FIG. 10. The power supply system 1b of the present embodiment is similar to the power supply system 1 shown in FIG. 1, and compared with the first side 31 of the substrate 3 of the power supply system 1 shown in FIG. 1 directly being surface-mounted to the second side 22 of the system board 2, and a first accommodating groove 331 being formed on the first side 31 of the substrate 3 by way of milling grooves, the first side 31 of the substrate 3 of the power supply system 1b of this embodiment is spaced from the second side 22 of the system board 2 and the power supply system 1b also includes a plurality of conductive structures 334. Each of the conductive structures 334 is composed of conductive pillars, each of the conductive structures 334 can be an integrally formed structure or a segmented structure composed of a plurality of components, one terminal of each conductive structure 334 is connected to the second side 22 of the system board 2, and the other terminal of each conductive structure 334 is connected to a corresponding conductive-connected region among the positive output conductive-connected region 51, the negative output conductive-connected region 52, the positive input conductive-connected region 53 or negative input 1 conductive-connected region 54 on the first side 31 of the substrate 3. In addition, each conductive structure 334, another adjacent conductive structure 334, the first side 31 of the substrate 3 and the second side 22 of the system board 2 define a first accommodating groove 331 together. Each first accommodating groove 331 is used to accommodate the corresponding output capacitor 4. In some embodiments, the two terminals of each conductive structure 334 used for welding can be wavy surfaces to achieve the effect of exhausting gas. Of course, the formation method and arrangement position of the conductive structure 334 are not limited, and are not described herein. As can be seen from the above, since the output capacitor 4 is located between the substrate 3 and the system board 2, and the output capacitor 4 is directly surface-mounted to the second side 22 of the system board 2, the electric energy transmitted by the power unit 6 is sequentially transmitted to the system board 2 via the substrate 3 and the conductive structure 334, and further transmitted to the output capacitor 4 and the load RL via the wiring in the system board 2.

Figure 12:
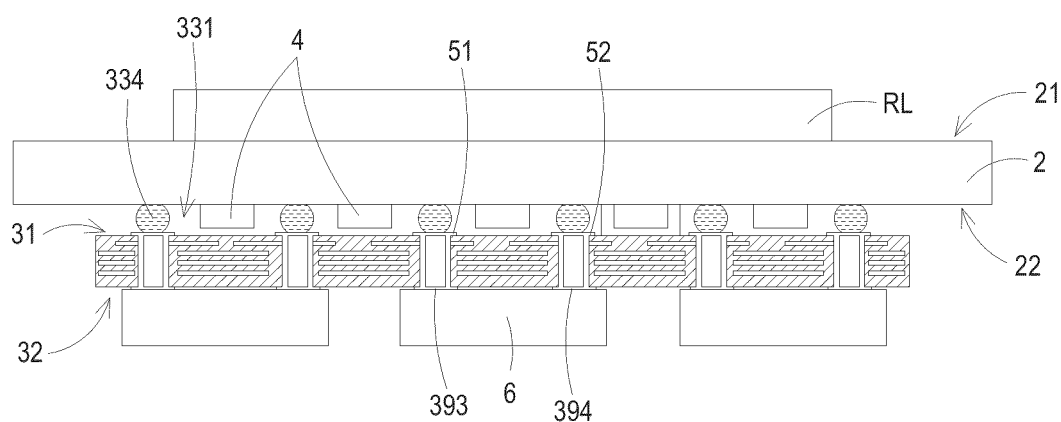
FIG. 12 is a schematic cross-sectional structure diagram of a power supply system according to a fourth embodiment of the disclosure.

In some embodiments, the conductive structures 334 can be formed not only in the structure of conductive pillars, but also in the structure of solder balls, and the formation method can be a Ball Grid Array (BGA), as shown in FIG. 12. FIG. 12 is a schematic cross-sectional structure diagram of a power supply system according to a fourth embodiment of the present disclosure. In order to avoid the possible collapse problem of the solder balls, the conductive structure 334 can be formed by using the solder balls with high temperature core, such as copper cores or high melting point solder cores. In some embodiments, in order to take into account both the collapse of the solder balls and cost considerations, solder balls with high temperature cores are arranged at four corners of the first side 31 of the substrate 3, and conventional solder balls are arranged at the remaining positions of the first side 31 of the substrate 3, so as to use the solder balls at the four corners of the substrate 3 to control the collapse of the solder balls at the remaining positions of the substrate 3, thereby improving the process yield of the power supply system 1c of this embodiment. In addition, since the power supply system 1b of the previous embodiment and the power supply system 1c of the present embodiment are directly provided with the conductive structure 334 to connect the substrate 3 and the system board 2 without additional processing of the substrate 3, the flatness of the power supply system 1b of the previous embodiment and the power supply system 1c of this embodiment is relatively high.

Figure 13:
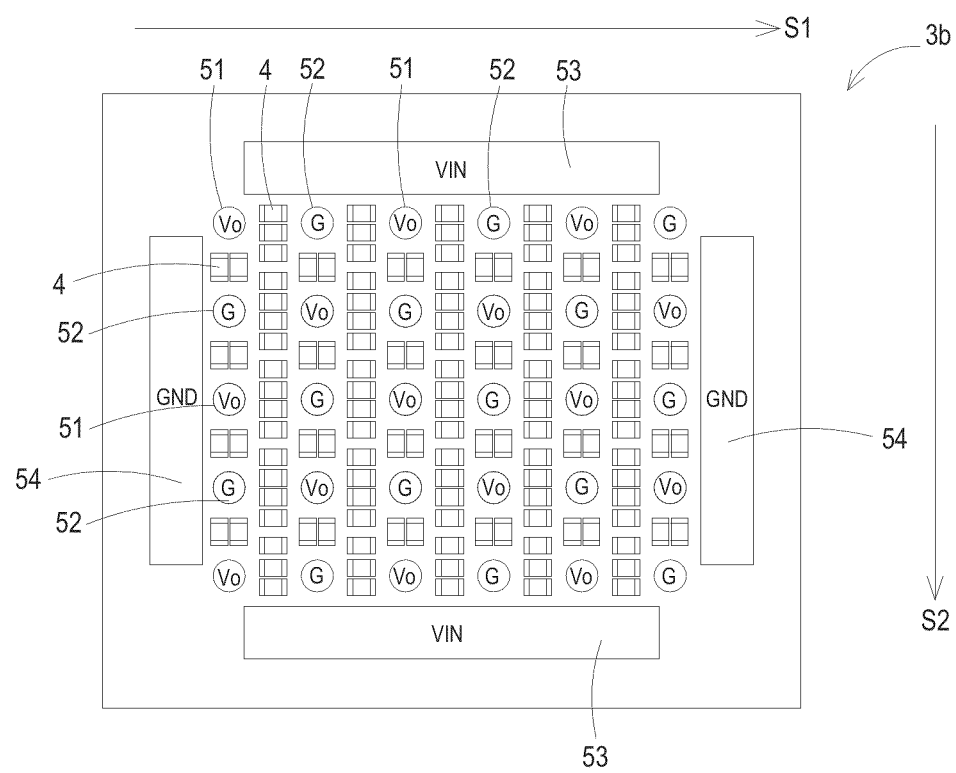
FIG. 13 is a schematic diagram of setting positions for another embodiment of various conductive-connected regions of the power supply system shown in FIG. 1.
Figure 14:
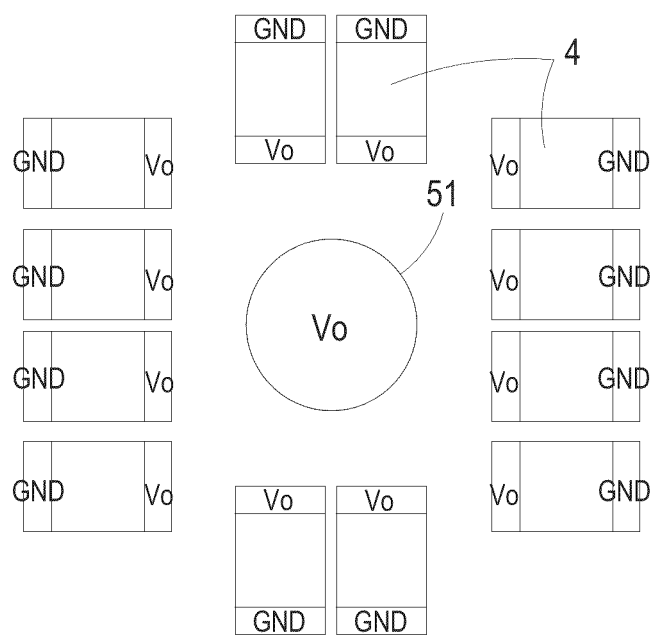
FIG. 14 is a schematic diagram showing a polarity relationship between positive output conductive-connected regions and adjacent output capacitors shown in FIG. 13.

In some embodiments, the setting positions of the plurality of positive output conductive-connected regions 51 and the plurality of negative output conductive-connected regions 52 on the first side 31 of the substrate 3 are not limited to the positions shown in FIGS. 2 and 3A, and can be adjusted according to needs. Referring to FIG. 13 and FIG. 14, wherein FIG. 13 is a schematic diagram showing the setting positions of various conductive-connected regions of the power supply system shown in FIG. 1 according to another embodiment, and FIG. 14 is a schematic diagram showing a polarity relationship between positive output conductive-connected regions and adjacent output capacitors shown in FIG. 13. As shown in FIG. 13, the plurality of positive output conductive-connected regions 51 and the plurality of negative output conductive-connected regions 52 of the substrate 3b of the present embodiment are interleaved with each other, and there is one corresponding negative output conductive-connected region 52 between every two adjacent positive output conductive-connected regions 51, and there is one corresponding positive output conductive-connected region 51 between every two adjacent negative output conductive-connected regions 52, wherein each output capacitor 4 is disposed between two adjacent conductive-connected regions, for example, disposed between the corresponding positive output conductive-connected region 51 and the corresponding negative output conductive-connected region 52. As shown in FIG. 13, in this embodiment, the positive output conductive-connected region 51 and the negative output conductive-connected region 52 connected to the output capacitor 4 are interleaved along the first direction S1, and are also interleaved along the second direction S2. The second direction S2 is perpendicular to the first direction S1. The current flows from the positive output conductive-connected region 51 via the output capacitor 4 to the negative output conductive-connected region 52, so as to form an output loop. Along the first direction, the current directions of the adjacent output loops are opposite, so that parasitic inductances of the adjacent output loops are partially offset, the efficiency of the power supply system is further improved; and along the second direction, the current directions of the adjacent output loops are also opposite, so that parasitic inductances of the adjacent output loops are partially offset, and the efficiency of the power supply system is further improved.

In FIG. 14, the positive output conductive-connected region 51 and the adjacent output capacitor 4 are used as examples to illustrate the polarities of the terminals of the output capacitor 4. In FIG. 14, a terminal on the output capacitor 4 is marked with Vo, which means that it is electrically connected with the positive output terminal Vout+. In FIG. 14, the other terminal on the output capacitor 4 is marked with GND, which means that it is electrically connected with the negative output terminal Vout−. As shown in FIG. 14, according to the setting method of FIG. 13, the polarity of the terminal adjacent to the positive output conductive-connected region 51 among the two terminals of each of output capacitors 4 is the same as the polarity of the positive output conductive-connected region 51. Of course, the polarities of the negative output conductive-connected region 52 and the terminals of the adjacent output capacitor 4 are also similar to that in FIG. 14, that is, the polarity of the terminal adjacent to the negative output conductive-connected region 52 among the two terminals of each output capacitor 4 is the same as the polarity of the negative output conductive-connected region 52, which is not repeated here. Due to the above-mentioned polarity characteristics of the terminals of the output capacitor 4, if the conductive structure connected to the positive output conductive-connected region 51 and the conductive structure connected to the negative output conductive-connected region 52 are accidentally connected to each other, there also no short circuit. In this embodiment, the shape of each positive output conductive-connected region 51 and the shape of each negative output conductive-connected region 52 are respectively circle, so that the area occupied by the positive output conductive-connected region 51 and the negative output conductive-connected region 52 on the first side 31 of the substrate 3 is relatively small, therefore on the premise that the area of the first side 31 of the substrate 3 is fixed, the number of the output capacitors 4 can be increased. Furthermore, since the plurality of the output capacitors 4 are connected in parallel, the equivalent series resistance of the increased number of output capacitors 4 decreases, so that the stability of the output voltage of the power supply system is improved.

Figure 15:
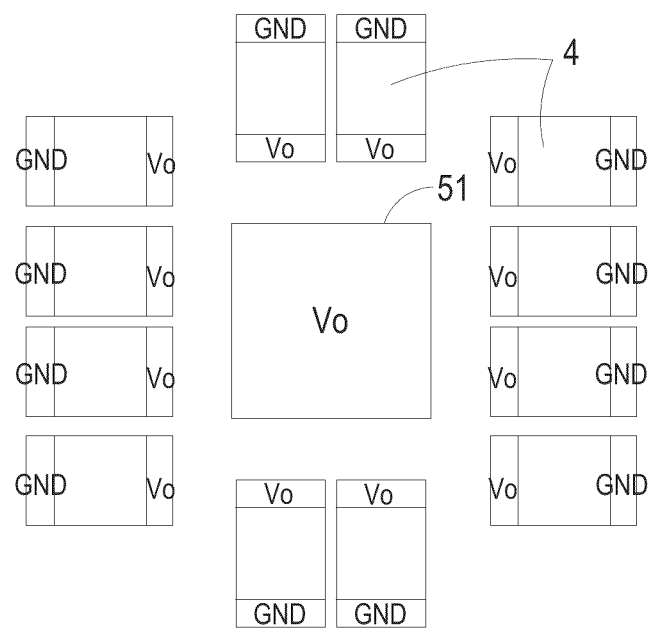
FIG. 15 is a schematic diagram of a polarity relationship of another embodiment of positive output conductive-connected regions and adjacent output capacitors shown in FIG. 13.

In other embodiments, the shape of each of positive output conductive-connected regions 51 is not limited to the circle shown in FIG. 14. FIG. 15 is schematic diagram of another exemplary polarity relationship of positive output conductive-connected regions and adjacent output capacitors shown in FIG. 13. As shown in FIG. 15, the shape of each positive output conductive-connected region 51 is a square respectively. Compared with the positive output conductive-connected region 51 which is a circle, the area of each positive output conductive-connected region 51 is increased, so that the current density flowing through the positive output conductive-connected region 51 is smaller. Of course, the shape of each negative output conductive-connected region 52 can also be a square, which will not be repeated here.

Figure 16:
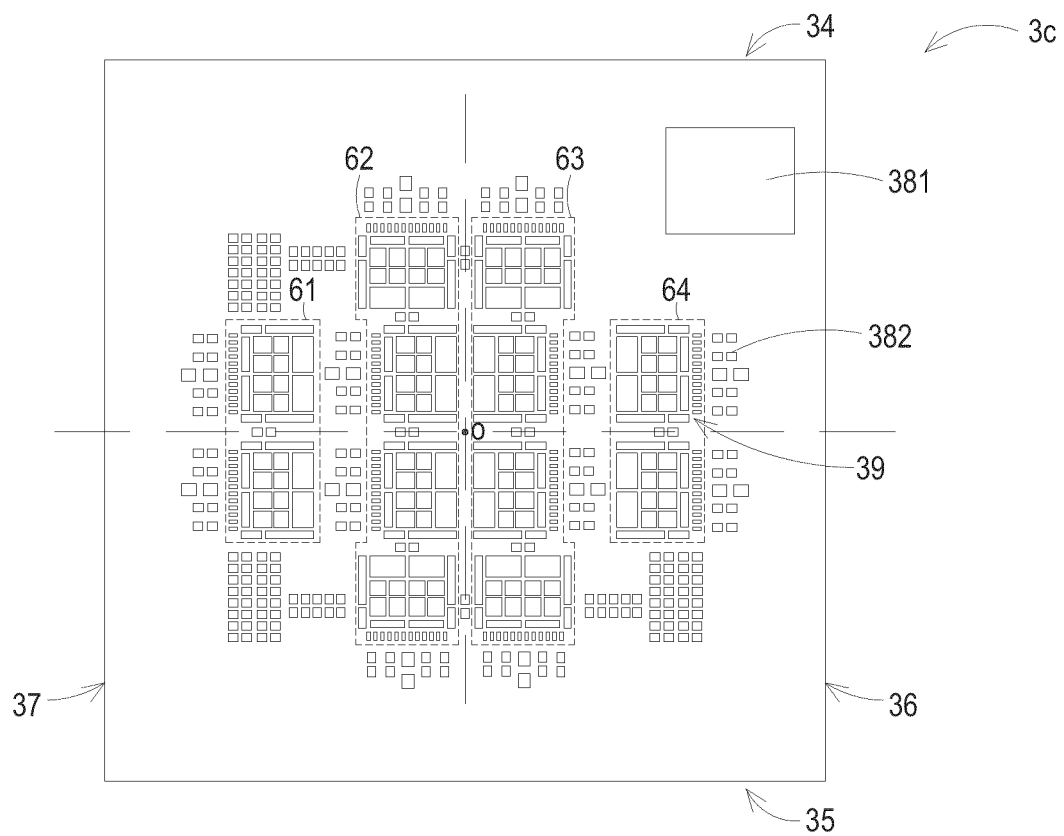
FIG. 16 is a schematic structural diagram of a second side of a substrate of a power supply system according to a fifth embodiment of the disclosure.
Figure 17:
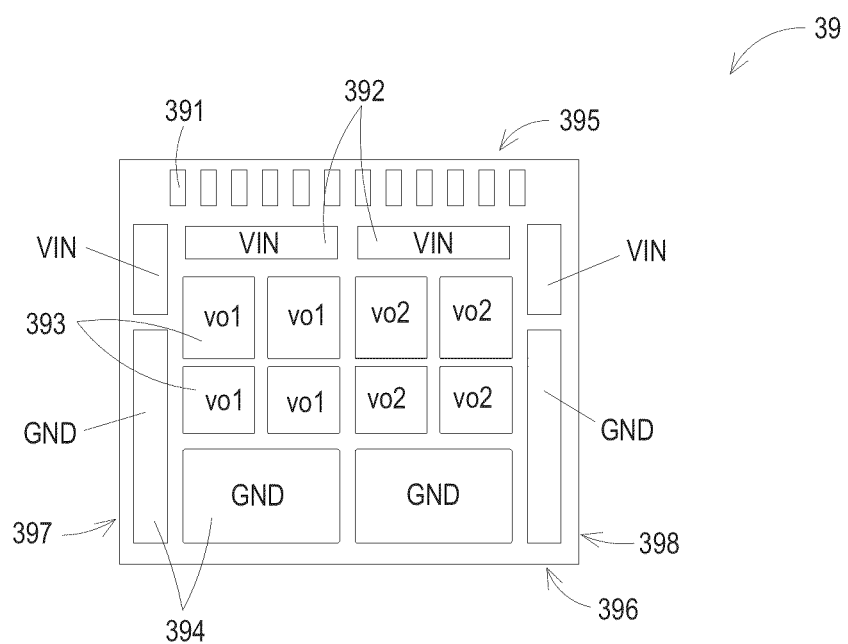
FIG. 17 is an enlarged schematic view of a first embodiment of the power unit pad of the power supply system shown in FIG. 16.

In some embodiments, the controller pads 381, the plurality of input capacitor pads 382 and the plurality of power unit pads 39 on the second side 32 of the substrate 3 are not limited to the arrangement shown in FIG. 7. Referring to FIGS. 16 and 17, FIG. 16 is a schematic structural diagram of the second side of the substrate of the power supply system according to the fifth embodiment of the disclosure, and FIG. 17 is an enlarged schematic view of a first embodiment of the power unit pad of the power supply system shown in FIG. 16. The second side 32 of the substrate 3c of the present embodiment is similar to the second side 32 of the substrate 3 shown in FIG. 7, but including a controller pad 381, a plurality of input capacitor pads 382 and a plurality of power unit pads 392. Compared with the setting positions of the plurality of power unit pads 39 as shown in FIG. 7, which constitute three arrangement rows, the setting positions of the plurality of power unit pads 39 in this embodiment constitute four arrangement rows, namely the first arrangement row 61, the second arrangement row 62, the third arrangement row 63 and the fourth arrangement row 64. Of course, the plurality of power units 6 corresponding to the plurality of power unit pads 39 are also set in four arrangement rows, and will not be described here.

In this embodiment, each power unit pad 39 includes a plurality of signal terminals 391, wherein the plurality of signal terminals 391 of each power unit pad 39 are set to one sideline relatively far from a center point O of the substrate 3 among four sidelines of the corresponding power unit pad 39. As shown in FIG. 16, the center point O of the substrate 3 is located at a center position between the second power unit 6 in the second arrangement row 62, the third power unit 6 in the second arrangement row 62, the second power unit 6 in the third arrangement row 63 and the third power unit 6 in the third arrangement row 63, while the signal terminals 391 of the two power unit pads 39 in the first arrangement row 61 are all located on one sideline relatively far from the center point O of the substrate 3 among the four sidelines of the corresponding power unit pad 39, that is, one sideline adjacent to the fourth sidewall 37 of the substrate 3 among the four sidelines of the power unit pad 39. The signal terminals 391 of the two power unit pads 39 respectively adjacent to the first sidewall 34 and the second sidewall 35 of the substrate 3 in the second arrangement row 62 are respectively located in one sideline relatively far away from the center point O of the substrate among four sidelines of the corresponding power unit pad 39, that is, respectively located in one sideline adjacent to the first sidewall 34 and the second sidewall 35 of the substrate 3 among four sidelines of the power unit pad 39. The signal terminals 391 of the two power unit pads 39 adjacent to the center point O of the substrate 3 in the second arrangement row 62 are all located in one sideline adjacent to the fourth sidewall 37 of the substrate 3 among four sidelines of the corresponding power unit pad 39. The signal terminals 391 of the two power unit pads 39 respectively adjacent to the first sidewall 34 and the second sidewall 35 of the substrate 3 in the third arrangement row 63 are respectively located in one sideline relatively far away from the center point O of the substrate 3 among four sidelines of the corresponding power unit pad 39, that is, respectively located in one sideline adjacent to the first sidewall 34 of the substrate 3 and one side line adjacent to the second sidewall 35 of the substrate 3 among four sidelines of the corresponding power unit pad 39. The signal terminals 391 of the two power unit pads 39 adjacent to the center point O of the substrate 3 in the third arrangement row 63 are all located in one sideline adjacent to the third sidewall 36 of the substrate 3 among four sidelines of the corresponding power unit pad 39, while the signal terminals 391 of the two power unit pads 39 in the fourth arrangement row 64 are all located in one sideline relatively far away from the center point O of the substrate 3 among four sidelines of the corresponding power unit pad 39, i.e., located in one sideline adjacent to the third sidewall 36 of the substrate 3 among four sidelines of the corresponding power unit pad 39.

The above arrangement shortens the path distance between the power unit 6 connected with the power unit pad 39 and the controller 7 connected with the controller pad 381, and reduces the signal delay of the control signal of the power unit 6. In this embodiment, each input capacitor pad 382 is adjacent to the signal terminal 391 of the corresponding power unit pad 39, so that the path distance between the input capacitor Cin connected with the input capacitor pad 382 and the power unit 6 connected with power unit pad 39 is reduced. In addition, combining the above-mentioned pad arrangement, the path distance between the power unit 6 connected with the second side 32 of the substrate 3 and the load RL connected with the first side 31 of the substrate 3 is also shortened, so that the impedance between the power unit 6 and the load RL is reduced and the current uniformity of the power unit 6 is improved. In this embodiment, each power unit 6 can be a one-phase, two-phase or multi-phase buck circuit, wherein if the power unit 6 is a multi-phase circuit, the power density of each power unit 6 can be greatly improved, so that the electrical energy required by the load RL can be provided even the required number of power units 6 in the power supply system is relatively low.

As shown in FIG. 17, each power unit pad 39 has a first sidewall 395, a second sidewall 396, a third sidewall 397 and a fourth sidewall 398, wherein the first sidewall 395 of the power unit pad 39 and the second sidewall 396 of the power unit pad 39 are disposed opposite to each other, and the third sidewall 397 of the power unit pad 39 and the fourth sidewall 398 of the power unit pad 39 are disposed opposite to each other, and are located between the first sidewall 395 and the second sidewall 396. Furthermore, in addition to a plurality of signal terminals 391, each power unit pad 39 further has a plurality of input terminals 392, a plurality of output terminals 393 and a plurality of ground terminals 394. The plurality of signal terminals 391 are sequentially arranged adjacent to the first sidewall 395 of the power unit pad 39 in sequence. The plurality of output terminals 393 are set at the center position of the power unit pad 39. The plurality of input terminals 392 and the plurality of ground terminals 394 are sequentially set around the plurality of output terminals 393, wherein a part of the plurality of input terminals 392 are adjacent to the third sidewall 397 of the power unit pad 39, a part of the plurality of input terminals 392 are adjacent to the fourth sidewall 398 of the power unit pad 39, and another part of the plurality of input terminals 392 are located between the signal terminals 391 and the output terminals 393, and a part of the plurality of ground terminals 394 are adjacent to the third sidewall 397 of the power unit pad 39, a part of the plurality of ground terminals 394 are adjacent to the second sidewall 396 of the power unit pad 39, and another part of the plurality of ground terminals 394 are adjacent to the fourth sidewall 398 of the power unit pad 39. In this embodiment, the connection holes in the substrate 3 connected to various terminals can be blind via structures, so as to reduce the spacing between the plurality of connection holes, thereby increasing the number of connection holes in the substrate 3 to achieve higher current flow capacity.

Figure 18:
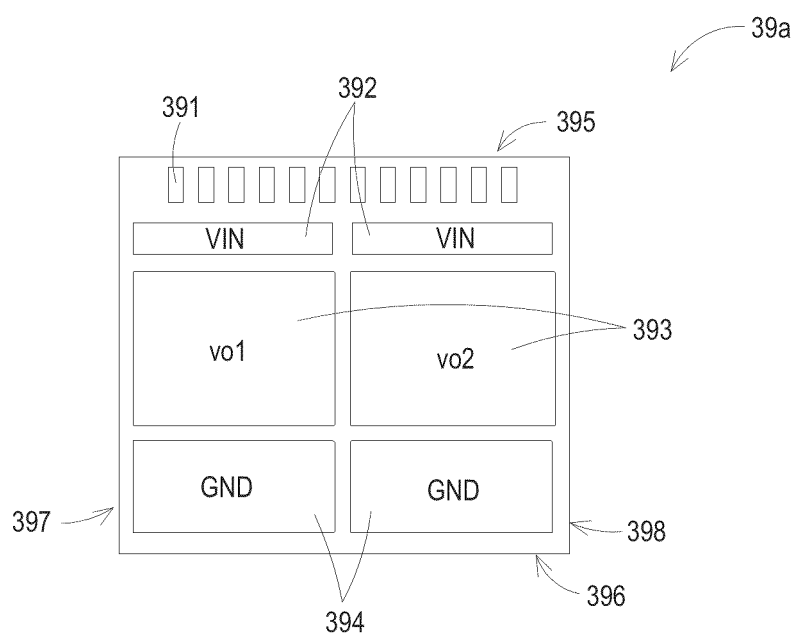
FIG. 18 is an enlarged schematic view of a second embodiment of power unit pad of the power supply system shown in FIG. 16.
Figure 19:
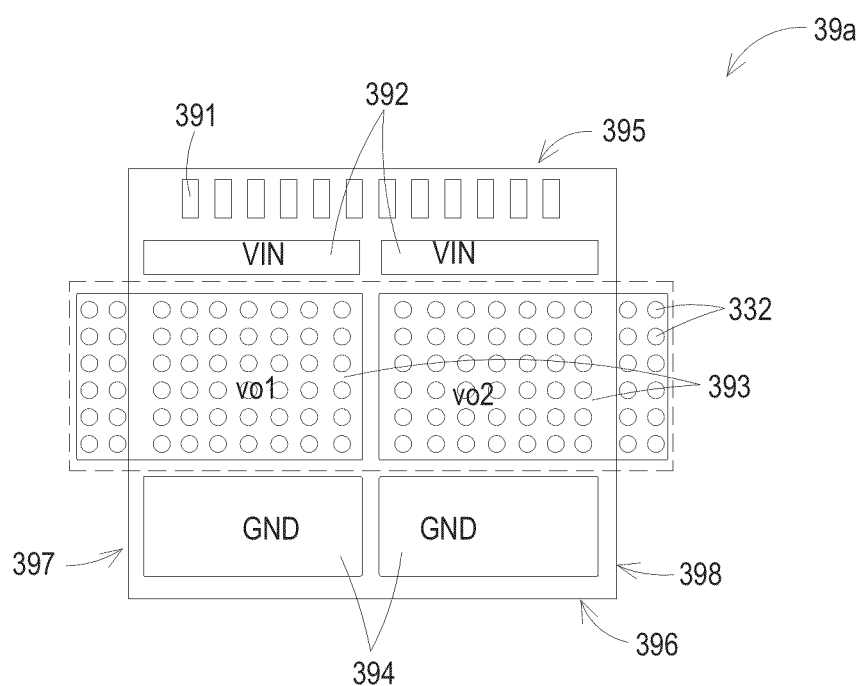
FIG. 19 is an enlarged schematic view of a third embodiment of the power unit pad of the power supply system shown in FIG. 16.
Figure 20:
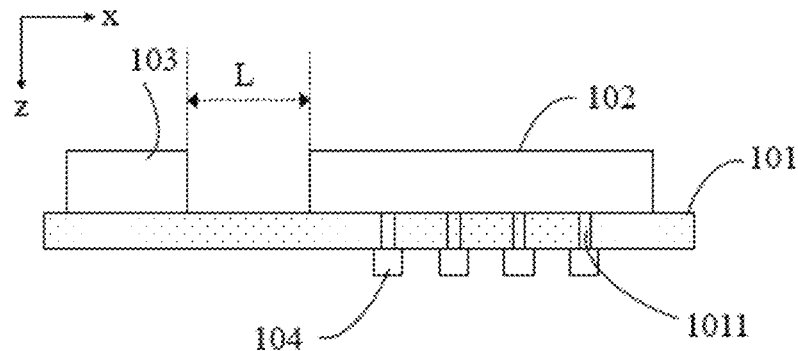
FIG. 20 is a schematic structure diagram of a horizontally powered electronic device in related arts.
Figure 21:
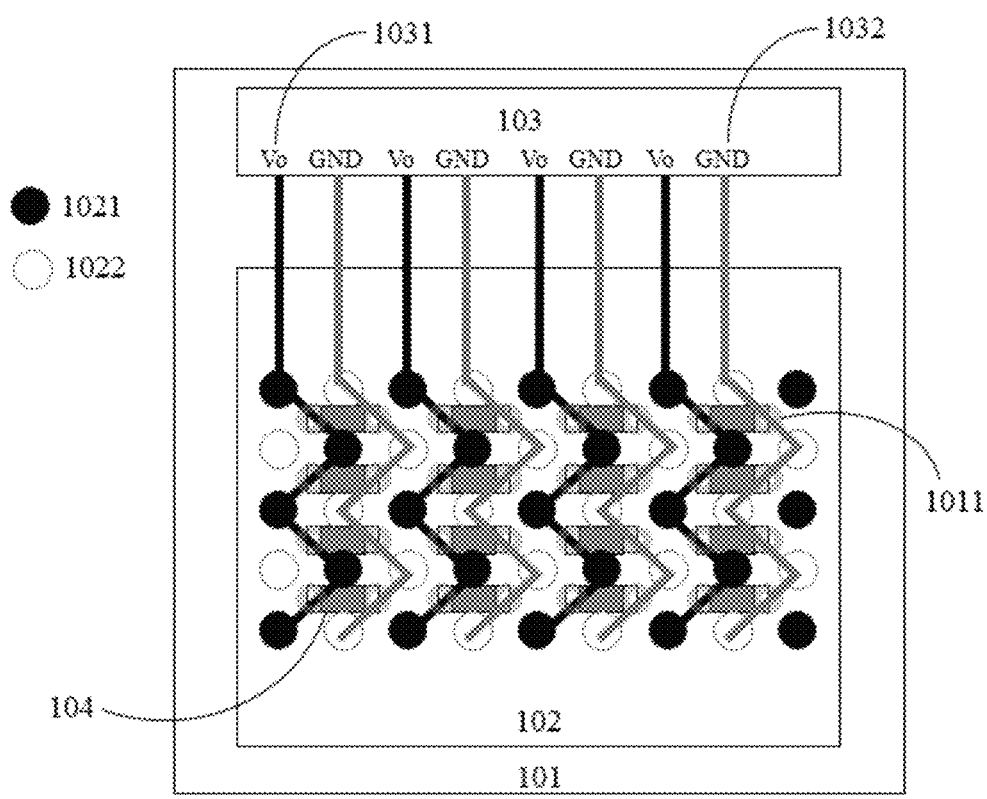
FIG. 21 is a schematic structure diagram of anther view of the electronic device shown in FIG. 20, showing pins of a horizontally powered load.
Figure 22:
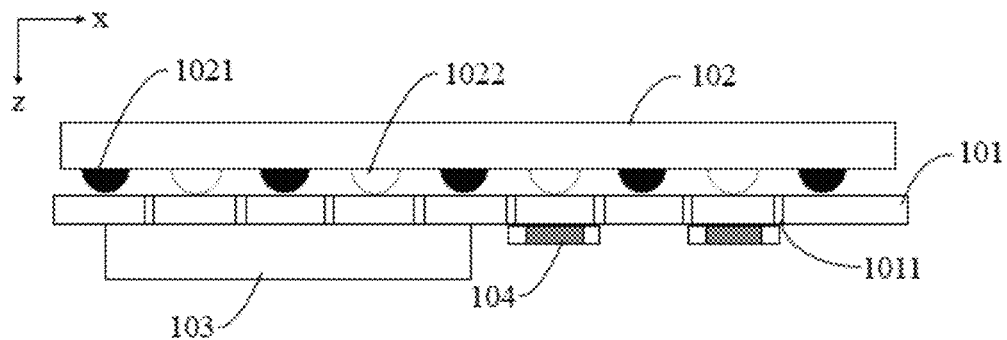
FIG. 22 is a schematic structure diagram of a vertically powered electronic device in related arts.
Figure 23:
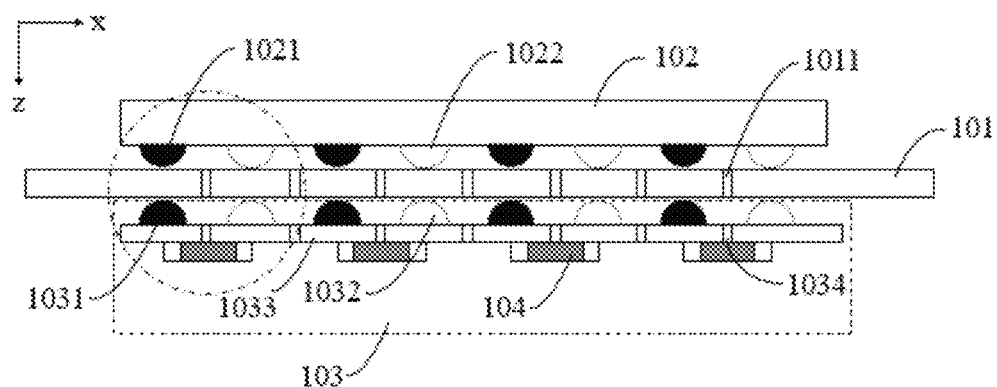
FIG. 23 is a schematic structure diagram of a vertically powered electronic device in related arts.
Figure 24:
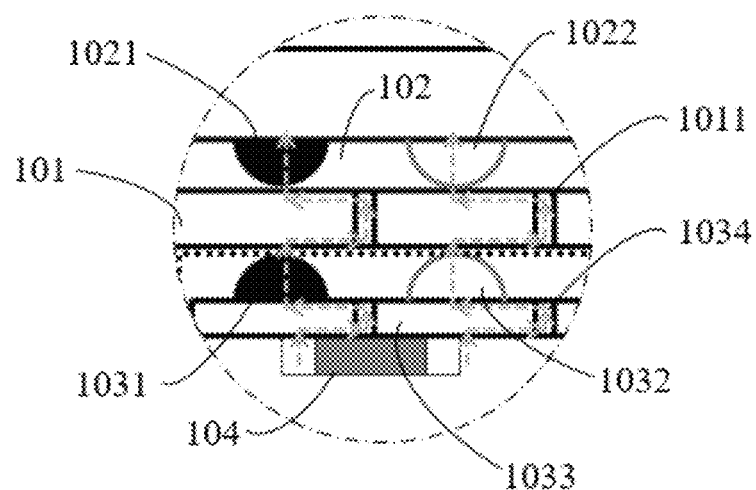
FIG. 24 is an enlarged view within the circle in FIG. 23.

In other embodiments, the setting positions of various terminals on the power unit pads are not limited to those shown in FIG. 17. Referring to FIG. 18, FIG. 18 is an enlarged schematic view of a second embodiment of power unit pad of the power supply system shown in FIG. 16. In this embodiment, the plurality of signal terminals 391 of the power unit pad 39a are adjacent to the first sidewall 395 of the power unit pad 39 and sequentially arranged, and the plurality of ground terminals 394 are adjacent to the second sidewall 396 of the power unit pad 39 and sequentially arranged, and the plurality of input terminals 392 are arranged in sequence and located between the plurality of signal terminals 391 and the plurality of output terminals 393, and the plurality of output terminals 393 are arranged in sequence and are located between a plurality of input terminals 392 and a plurality of ground terminals 394. Because the current flowing through the output terminal 393 is larger, so in some embodiments, the setting range of the output terminals 393 is increased for the actual needs of the circuit, so that the setting positions of the output terminals 393 may protrude from the third sidewall 397 and the fourth sidewall 398 of the power unit pad 39, shown in FIG. 19, which is an enlarged schematic view of a third embodiment of the power unit pad of the power supply system shown in FIG. 16. In order to correspondingly connect the output terminals 393 protruding from the third sidewall 397 and the fourth sidewall 398 of the power unit pad 39, a larger number of connection holes 332 may be provided on the substrate 3 to connect the output terminals 393 protruding from the third sidewall 397 and the fourth sidewall 398 of the power unit pad 39, and the above arrangement can achieve a higher current flow capacity.

Embodiments of the present disclosure also provide an electronic device, which includes a load RL and any one of the power supply system 1, the power supply system 1a, the power supply system 1b, and the power supply system 1c of the foregoing embodiments, and the power supply system 1, the power supply system 1a, the power supply system 1b, and the power supply system 1c are used to supply power to the load RL.

In summary, the present disclosure provides a power supply system and an electronic device, wherein the output capacitor of the power supply system is surface-mounted on the second side of the system board, and the load is disposed on the first side of the system board, so that the connection path between the output capacitor and the load is very short, that is, the connection path between the output capacitor and the load is only the wiring connected between the output capacitor and the load in the system board, so that the connection impedance between the output capacitor and the load is also low, which improves the power supply performance of the power unit, thereby the overall performance of the power supply system of the present disclosure is also improved. In addition, since each output capacitor is disposed in the corresponding accommodating groove on the substrate, and the output capacitor is located between the corresponding positive output conductive-connected region and the corresponding negative output conductive-connected region, that is, the current on the output capacitor can evenly flow to the positive output terminal and the negative output terminal, so that the uniform current flow effect between the positive output conductive-connected region constituting the positive output terminal and the negative output conductive-connected region constituting the negative output terminal is very significant.

Figure 25:
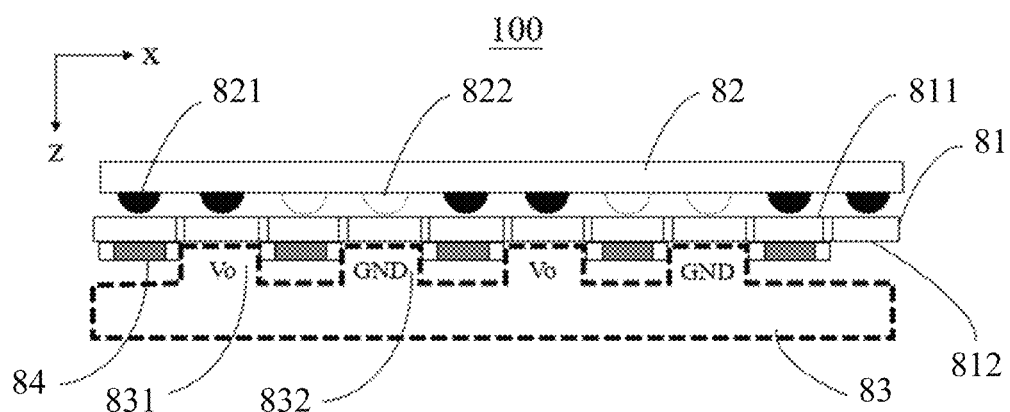
FIG. 25 is a side view of an electronic device according to an embodiment of the present disclosure.
Figure 26:
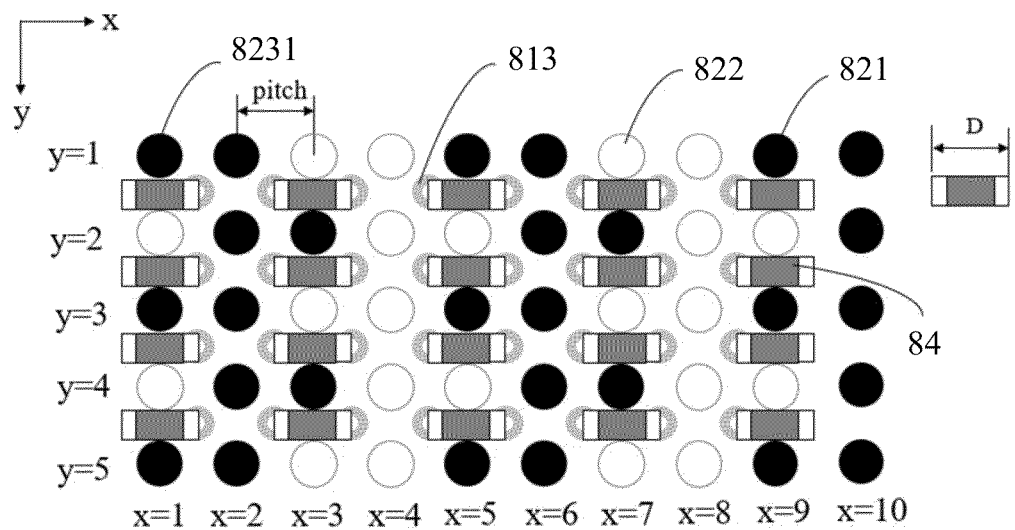
FIG. 26 is a schematic structure diagram of another view of the electronic device shown in FIG. 25, showing one arrangement of a power supply region of a load.

FIGS. 25 to 29 show a structure of an electronic device according to an embodiment of the present disclosure. In this embodiment, the electronic device 100 includes a system board 81, a load 82, at least one column of output capacitors 84 and a power supply apparatus 83. The output capacitors 84 are connected between the power supply apparatus 83 and the load 82, and used for filtering the energy input to the load 82. It is defined that the z-direction shown in FIG. 25 is a first direction, the x-direction shown in FIG. 25 is a second direction and the y-direction shown in FIG. 26 is a third direction. The first direction z, the second direction x and the third direction y are perpendicular to each other. The load 82 is, for example, a processor chip. The processor chip includes a CPU, GPU, TPU, or NPU. In an alternative embodiment, the load 82 may also be other types of electronic apparatus, parts or components that require power supply, all of which fall within the protection scope of the present disclosure. The system board 81 is a PCB board, and includes a first side 811 and a second side 812 located opposite to each other along the first direction z. In the view of FIG. 25, the first side 811 is the upper surface of the system board 81, and the second side 812 is the lower surface of the system board 81, which may also be called a back side. In some embodiments, the power supply apparatus 83 described below is referred to be or includes the power unit 6 described above.

As shown in FIG. 25, the load 82 is located on the first side 811 of the system board 81. The load 82 includes a rectangular power supply region. As shown in FIG. 26, the power supply region includes load pins arranged in a plurality of rows along the second direction x and in a plurality of columns along the third direction y, where the second direction x is the row direction and the third direction y is the column direction. Exemplary, the power supply region includes at least three rows of the load pins. The load pins include a plurality of load input pins 821 and a plurality of load ground pins 822. Each column of the output capacitors 84 is located on the second side 812 of the system board 81 along the third direction y. The power supply apparatus 83 is located on the second side 812 of the system board 81. One side of the power supply apparatus 83 facing the system board 81 is provided with a plurality of power supply pins, and each of the power supply pins is connected to the load pin of a same polarity through a conductive structure 813 of the system board 81. The conductive structure 813 includes a via or a blind buried hole.

Figure 27:
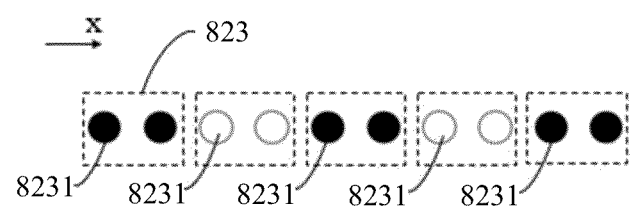
FIG. 27 is a schematic diagram of a first arrangement row of the power supply region of the load shown in FIG. 26.

At least one row of the load pins on the power supply region is a first arrangement row. As shown in FIG. 26, in this embodiment, the three rows corresponding to y=1, y=3 and y=5 are the first arrangement rows. As shown in FIG. 27, the first arrangement row includes a plurality of load pin groups 823 arranged sequentially along the second direction x. Each of the load pin groups 823 includes at least two load pins of the same polarity, and each of the load pin groups 823 and an adjacent load pin group 823 are of opposite polarities. Thus, in the first arrangement row, the load pin groups 823 with different polarities may be arranged alternatively in the x-direction, which facilitates good decoupling. Moreover, the load pins of the same polarity appear consecutively each time, and are all consecutive not less than 2 times.

Each dashed box in FIG. 27 shows one load pin group 823, the first load pin group 823 includes two load input pins 821, the second load pin group 823 includes two load ground pins 822, the third load pin group 823 includes two load input pins 821, and so on. In this embodiment, in the first arrangement row, each group of the load input pins 821 is provided with a same number of pins, each group of the load ground pins 822 is provided with a same number of pins, and the number of pins of the load input pins 821 of each group and the number of pins of the load ground pins 822 of each group are the same, but the present disclosure is not limited to this. The number of the load pins in each of the load pin groups 823 is not limited to 2, but may also be 3, 4, or more, as long as the number of the load pins in each of the load pin groups 823 is satisfied to be greater than or equal to 2. A first load pin in the second direction x of each of the load pin groups 823 in the first arrangement row is defined as a first position pin 8231, for example, the leftmost pin in each dashed box in FIG. 27 is the first position pin 8231. The power supply region may include one first arrangement row or a plurality of first arrangement rows. When the power supply region includes a plurality of first arrangement rows, each of the first arrangement rows is arranged in a same form.

As can be seen in conjunction with FIGS. 26 and 27, two ends of a vertical projection of each column of the output capacitors 84 on the power supply region are located at two sides of a centerline, in the third direction, of at least one first position pin 8231. In this embodiment, the vertical projection of the output capacitor 84 on the power supply region refers to the orthographic projection of the output capacitor 84, on the xy plane, along the third direction z. For example, in the view of FIG. 26, two ends of the vertical projection of the first column of the output capacitors 84 on the power supply region are located at the left and right sides of the centerline, in the third direction, of the first position pin 8231 of the first load pin group 823. Two ends of the vertical projection of the second column of the output capacitors 84 on the power supply region are located at the left and right sides of the centerline, in the third direction, of the first position pin 8231 of the second load pin group 823, and so on. In this embodiment, the number of columns of the output capacitors 84 is equal to the number of the load pin groups 823 in a first arrangement row, i.e., the first position pin 8231 of each of the load pin groups 823 of one first arrangement row corresponds to one column of the output capacitors 84, the two ends of the vertical projection of each column of the output capacitors 84 on the power supply region are located at the left and right sides of the centerline, in the third direction, of the corresponding first position pin 8231. In an alternative embodiment, it is also possible to provide the output capacitors 84 with a smaller number of columns, for example, only the first position pin 8231 of each of the first load pin group 823 and the third load pin group 823 corresponds to one column of the output capacitors 84, etc., which fall within the protection scope of the present disclosure. In the third direction y, a vertical projection of the output capacitor 84 on the power supply region is located between two adjacent rows of the load pins. One row of the output capacitors 84 is provided between every two adjacent rows of the load pins. In a different embodiment, the number of rows of the output capacitors 84 may also be increased or decreased as desired. A better filtering effect can be obtained when the number of the output capacitors 84 is larger.

As shown in FIG. 25, the output capacitors 84 used for filtering are placed at the back side of the system board 81, the output capacitors 84 are closer to the load input pins 821 and the load ground pins 822, which results in a better filtering effect, and the output capacitors 84 and the power supply apparatus 83 are reasonably placed to avoid each other. As shown in FIG. 26, the two terminals (two ends) of the output capacitors 84 may be neatly distributed at two sides of the centerline, in the third direction y, of the first position pin of each load pin groups of the first arrangement row. The power supply pins of the power supply apparatus 83 are more regularly connected to the system board 81, and there are more conductive structures 813 to carry the current of power supply apparatus 83. The structure of the electronic device can effectively improve the vertical power supply capability of the power supply apparatus 83 to the load 82, causing that the power supply apparatus 83 can provide a larger vertical power supply current to the load 82.

Figure 28:
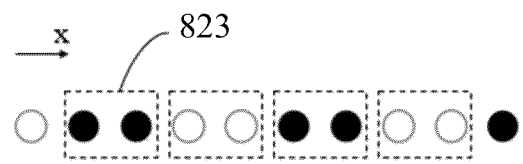
FIG. 28 is a schematic diagram of a second arrangement row of the power supply region of the load shown in FIG. 26.

At least one row of the load pins on the power supply region is a second arrangement row. As shown in FIG. 26, the two rows corresponding to y=2 and y=4 are the second arrangement rows. When the power supply region includes a plurality of the second arrangement rows, the plurality of the second arrangement rows are also arranged in the same form. The first arrangement rows and the second arrangement rows are arranged alternatively in the third direction y, but the present disclosure is not limited to this. FIG. 28 exemplarily shows a structure of a second arrangement row. An arrangement of the load pins of the second arrangement row is shifted by one load pin along the second direction x relative to an arrangement of the load pins of the first arrangement row. A first load pin and a second load pin, in the second direction x, of the second arrangement row are of opposite polarities. Comparing FIG. 28 and FIG. 27, the arrangement of the load pins of the second arrangement row can be seen that the arrangement of the load pins of the first arrangement row is shifted as a whole by one load pin to the right, and a load pin, having an opposite polarity to the second load pin located in the second arrangement row is determined as the first load pin of the second arrangement row. As shown in FIG. 28, because the second load pin located in the second arrangement row is the load input pin 821, the first load pin of the second arrangement row is the load ground pin 822. The number of the second arrangement row may be optionally set as desired. In a different embodiment, all rows of the power supply region may be the first arrangement row or include a combination of one or more first arrangement rows and one or more second arrangement rows. The first arrangement rows and the second arrangement rows may be arranged alternatively in the third direction y, e.g., rows 1, 3, 5 are the first arrangement rows and rows 2, 4 are the second arrangement rows, or the first arrangement rows and the second arrangement rows may be irregularly arranged, e.g. rows 1, 2, 5 are the first arrangement rows and rows 3 and 4 are the second arrangement rows, or rows 1, 2, 4 and 5 are the first arrangement rows and row 3 is the second arrangement row.

Figure 29:
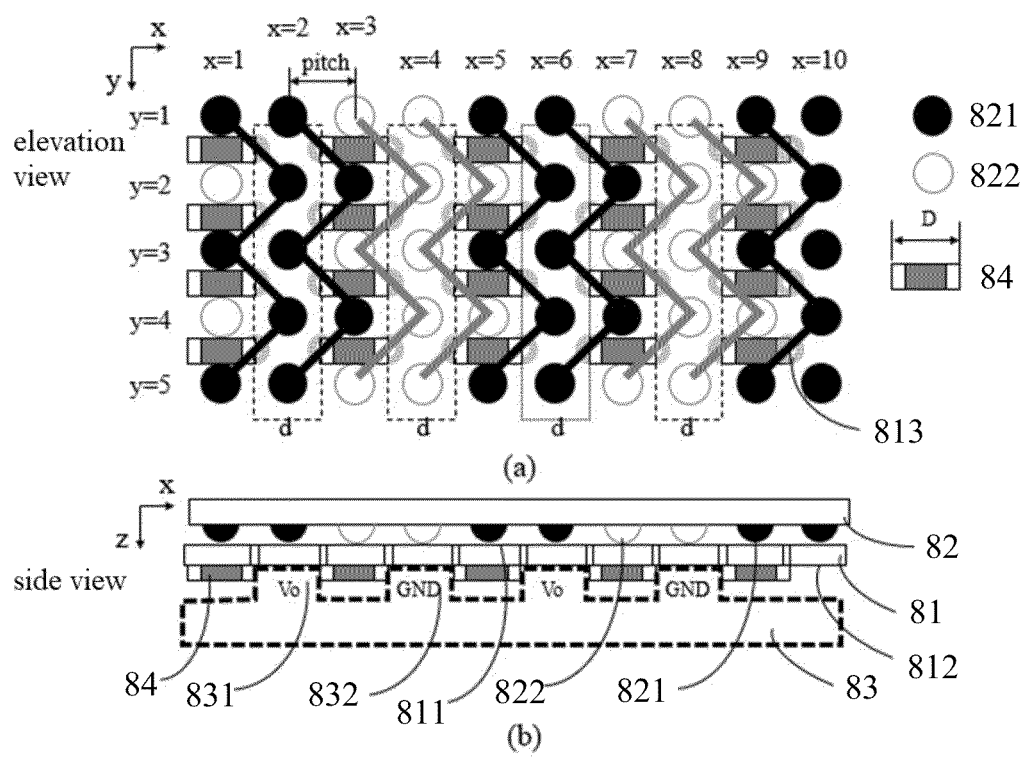
FIG. 29($a$) and FIG. 29($b$) are schematic diagrams of one arrangement and wiring of the power supply region of the load according to an embodiment of the present disclosure.

FIG. 29 shows the wiring manner of the load pins in FIG. 26. As can be seen in FIG. 29, by using this arrangement manner, the first load input pin 821 or the first load ground pin 822 of each of the first arrangement rows may finally be interconnected through zigzag wiring without any disconnection, which is beneficial to the layout design of the system board 81. The conductive structures 813 of each column are connected through zigzag wiring, and are of the same polarity, and at least two adjacent columns of the conductive structures are of the same polarity, which is beneficial to the layout design. When the power supply region includes both the first arrangement rows and second arrangement rows, the load input pins and the load output pins can form an alternative arrangement in the second direction x and the third direction y at the same time, so the placement of the output capacitors 84 are more flexible.

As shown in FIG. 29(*a*) and FIG. 29(*b*), the power supply pins of the power supply apparatus 83 include power supply output pins 831 (denoted as Vo in the figure) and power supply ground pins 832 (denoted as GND in the figure), and each of the power supply pins is located between two adjacent columns of the output capacitors 84, thus providing a spatial advantageous position relationship, among the load pins, output capacitors 84, and power supply pins, for vertical power supply. The power supply output pins 831 and the load input pins 821 are both Vo polarity, and the power supply ground pins 832 and the load ground pins 822 are both GND polarity. The power supply output pins 831 and the power supply ground pins 832 are arranged alternatively in the second direction x. In the second direction x, a length of each of the power supply pins is less than or equal to a center distance between two adjacent first position pins 8231 minus a length D of the output capacitor 84. In this embodiment, the center distance between two adjacent first position pins 8231 is equal to 2*pitch (pitch indicates the center distance between two adjacent load pins). Therefore, in the second direction x, the length d of each of the power supply pins satisfies d≤2*pitch-D, and the center distance between two adjacent power supply pins is 2*pitch.

As shown in FIG. 29(*a*) and FIG. 29(*b*), a plurality of columns of conductive structures 813 are provided at a position of the system board 81 corresponding to the power supply region, each column of the conductive structures 813 is located at one side of one column of the output capacitors 84, and each of the conductive structures 813 is aligned with an adjacent output capacitor 84 in the second direction x. The load pins of one column adjacent to a first side of the vertical projection of each column of the output capacitors 84 on the power supply region are of a same polarity, the load pins of another column adjacent to a second side of the vertical projection of each column of the output capacitors 84 on the power supply region are of a same polarity, and the load pins of the one column adjacent to the first side and the load pins of the another column adjacent to the second side are of opposite polarities. For example, the load pins (load pins of x=2) of one column adjacent to the right side of the first column of the output capacitors 84 are all load input pins 821, the load pins (load pins of x=2) of one column adjacent to the left side of the second column of the output capacitors 84 are all load input pins 821, and the load pins (x=4) of one column adjacent to the right side of the second column of the output capacitors 84 are all load ground pins 822, the load pins (x=4) of one column adjacent to the left side of the third column of the output capacitors 84 are all load ground pins 822, the load pins (x=6) of one column adjacent to the right side of the third column of the output capacitors 84 are all load input pins 821, and so on.

As shown in FIG. 29(*a*) and FIG. 29(*b*), in this embodiment, the conductive structures 813 of a same column are connected to the power supply pins of the same polarity, causing that the output capacitors 84 may be provided in columns aligned between two columns of the conductive structures 813. For example, in the views of FIG. 29(*a*) and FIG. 29(*b*), the first column of the conductive structures 813 are all connected to the power supply output pins 831 through zigzag wiring, the second column of the conductive structures 813 are all connected to the power supply output pins 831 through zigzag wiring, and the third column of the conductive structures 813 are all connected to the power supply ground pins 832 through zigzag wiring. The positions of the power supply output pins 831 and the power supply ground pins 832 of the power supply apparatus 83 both correspond to the conductive structures 813 of the same polarity, and all conductive structures 813 can pass current without exceeding their through-current capability. Capacitor pins, of two adjacent output capacitors 84, facing with each other in the second direction x are of a same polarity. Each of the power supply pins and an adjacent pin of the output capacitor 84 are of a same polarity. The output capacitors 84 can be neatly arranged, and it is easier to lead out the pins of the power supply apparatus 83. For example, in the views of FIG. 29(*a*) and FIG. 29(*b*), in the second direction x, the right end of the first column of the output capacitors 84 and the left end of the second column of the output capacitors 84 are facing with each other, and are of the same polarity; the right end of the second column of the output capacitors 84 and the left end of the third column of the output capacitors 84 are facing with each other, and are of the same polarity, and so on, and the subsequent columns of the output capacitors 84 have the same characteristics. The space between two adjacent columns of the output capacitors 84 may be left for the pins of the power supply apparatus 83 to make connections. Another feature of the arrangement of FIG. 29(*a*) and FIG. 29(*b*) is that the first arrangement rows and the second arrangement rows are arranged alternatively, which, in addition to the benefits mentioned above, can also form an alternative arrangement of pins, of different polarities, in the y-direction, so that the output capacitors can even be rotated 90° to arrange along the y-direction, improving the flexibility of the arrangement of the output capacitors and making it more conducive to the design of the system.

Figure 30:
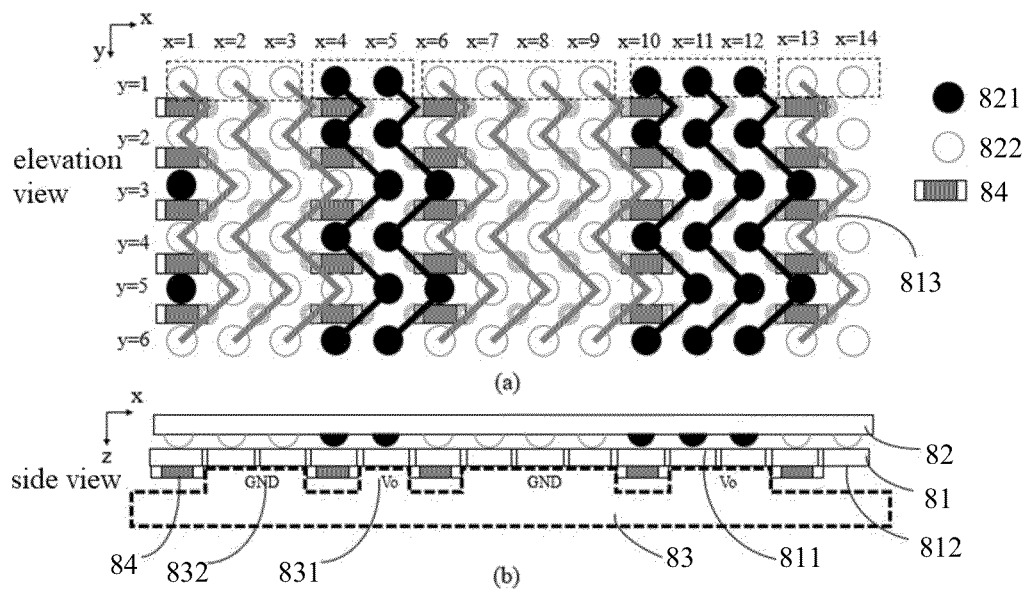
FIG. 30($a$) and FIG. 30($b$) are schematic structure diagrams of the electronic device according to another embodiment of the present disclosure, showing a schematic diagram of another arrangement and wiring of the power supply region of the load.

As shown in FIG. 30(*a*) and FIG. 30(*b*), a schematic diagram of another electronic device and an arrangement manner of the power supply region therein according to an embodiment of the present disclosure are shown. The difference between this embodiment and the arrangement manner shown in FIG. 29(*a*) and FIG. 29(*b*) is that the first arrangement row is arranged in a different form. In the arrangement manner shown in FIG. 30(*a*) and FIG. 30(*b*), y=1, y=2, y=4 and y=6 are the first arrangement rows, and y=3 and y=5 are the second arrangement rows. In the first arrangement row, the first load pin group 823 includes three load ground pins 822, the second load pin group 823 includes two load input pins 821, the third load pin group 823 includes four load ground pins 822, the fourth load pin group 823 includes three load input pins 821, and the fifth load pin group 823 includes two load ground pins 822. Thus, the first arrangement row in FIG. 30(*a*) and FIG. 30(*b*) likewise satisfies the arrangement rule of including a plurality of load pin groups 823 arranged sequentially along the second direction, each of the load pin groups 823 including at least two load pins of a same polarity, and each of the load pin groups 823 and an adjacent load pin group 823 being of opposite polarities. Moreover, the number of the load pins included in different load pin groups 823 having the same polarity may be different, and the number of the load pins included in different load pin groups 823 having different polarities may also be different. An arrangement of the load pins of the second arrangement row is shifted by one load pin along the second direction x relative to an arrangement of the load pins of the first arrangement row, and a first load pin and a second load pin, in the second direction, of the second arrangement row are of opposite polarities.

As shown in FIG. 30(*a*) and FIG. 30(*b*), two ends of a vertical projection of each column of the output capacitors 84 on the power supply region are located at two sides of a centerline, in the third direction, of at least one first position pin 8231. For example, in the views of FIG. 30(*a*) and FIG. 30(*b*), the two ends of the vertical projection of the first column of the output capacitors 84 on the power supply region are located at the left and right sides of the centerline, in the third direction, of the first position pin 8231 of the first load pin group 823. The two ends of the vertical projection of the second column of the output capacitors 84 on the power supply region are located at the left and right sides of the centerline, in the third direction, of the first position pin 8231 of the second load pin group 823, and so on. In this embodiment, the number of columns of the output capacitors 84 is equal to the number of the load pin groups 823 in a first arrangement row, i.e., the first position pin 8231 of each of the load pin groups 823 of one first arrangement row corresponds to one column of the output capacitors 84, and the two ends of the vertical projection of each column of the output capacitors 84 on the power supply region are located at two sides of the centerline, in the third direction, of the corresponding first position pin 8231. In the third direction y, a vertical projection of the output capacitor 84 on the power supply region is located between two adjacent rows of the load pins. One row of the output capacitors 84 is provided between every two adjacent rows of the load pins. In a different embodiment, the number of rows and columns of the output capacitors 84 may be increased or decreased as desired. A better filtering effect can be obtained when the number of the output capacitors 84 is larger.

This arrangement manner also has a good load power supply performance. Specifically, the output capacitors 84 used for filtering are placed at the back side of the system board 81, and the output capacitors 84 are closer to the load input pins 821 and the load ground pins 822, which results in a better filtering effect; and the output capacitors 84 and the power supply apparatus 83 are reasonably placed to avoid each other. The two terminals of the output capacitor 84 may be neatly distributed at two sides of the centerline, in the third direction y, of the first position pin of each load pin groups of the first arrangement row. The power supply pins of the power supply apparatus 83 are more regularly connected to the system board 81, and a relatively simple process may be used to manufacture such neatly and regularly arranged pins of the power supply apparatus, reducing manufacturing costs; and at the same time, this connection will cause that there are more conductive structures 813 to carry the current of the power supply apparatus 83. The structure of the electronic device can effectively improve the vertical power supply capability of the power supply apparatus 83 to the load 82, causing that the power supply apparatus 83 can provide a larger vertical power supply current to the load 82.

As can be seen in FIG. 30(*a*) and FIG. 30(*b*), by using this arrangement manner, the first load input pin 821 or the first load ground pin 822 of each of the first arrangement rows may finally be interconnected through zigzag wiring without any disconnection, which is beneficial to the layout design of the system board 81. The conductive structures 813 of each column are connected through zigzag wiring, and are of the same polarity, and at least two adjacent columns of the conductive structures are of the same polarity, which is beneficial to the layout design. When the power supply region includes both the first arrangement rows and second arrangement rows, the load input pins and the load output pins can form an alternative arrangement in the second direction x and the third direction y at the same time, so the placement of the output capacitors 84 are more flexible.

As shown in FIG. 30(*a*) and FIG. 30(*b*), each of the power supply pins is provided between two adjacent columns of the output capacitors 84. The power supply output pins 831 and the power supply ground pins 832 are arranged alternatively in the second direction x. In the second direction x, a length of each of the power supply pins is less than or equal to a center distance between two adjacent first position pins 8231 minus a length D of the output capacitor 84. In this embodiment, the center distance between the first position pin 8231 of the first load pin group 823 and the first position pin 8231 of the second load pin group 823 is equal to 3*pitch (pitch indicates the center distance between two adjacent load pins, see the examples in FIG. 29(*a*) and FIG. 29(*b*)). Thus, in the second direction x, the length of the first power supply pin is ≤3*pitch-D. By increasing the center distance between two adjacent first position pins, the maximum pin length of the power supply apparatus may also be increased, which facilitates the fabrication of the pins of the power supply apparatus, reduces the production difficulty, and improves production yields.

As shown in FIG. 30(*a*) and FIG. 30(*b*), a plurality of columns of conductive structures 813 are provided at a position of the system board 81 corresponding to the power supply region, each column of the conductive structures 813 is located at one side of one column of the output capacitors 84, and each of the conductive structures 813 is aligned with an adjacent output capacitor 84 in the second direction. The load pins of one column adjacent to a first side of the vertical projection of each column of the output capacitors 84 on the power supply region are of a same polarity, the load pins of another column adjacent to a second side of the vertical projection of each column of the output capacitors 84 on the power supply region are of a same polarity, and the load pins of the one column adjacent to the first side and the load pins of the another column adjacent to the second side are of opposite polarities. For example, the load pins (load pins of x=2) of one column adjacent to the right side of the first column of the output capacitors 84 are all load ground pins 822, the load pins (load pins of x=3) of one column adjacent to the left side of the second column of the output capacitors 84 are all load ground pins 822, and the load pins (x=5) of one column adjacent to the right side of the second column of the output capacitors 84 are all load input pins 821, the load pins (x=5) of one column adjacent to the left side of the third column of the output capacitors 84 are all load input pins 821, the load pins (x=7) of one column adjacent to the right side of the third column of the output capacitors 84 are all load ground pins 822, and so on.

As shown in FIG. 30(*a*) and FIG. 30(*b*), in this embodiment, the conductive structures 813 of a same column are connected to the power supply pins of the same polarity, causing that the output capacitors 84 may be provided in columns aligned between the two columns of the conductive structures 813. For example, in the views of FIG. 30(*a*) and FIG. 30(*b*), the first column of the conductive structures 813 are all connected to the power supply ground pins 832 through zigzag wiring, the second column of the conductive structures 813 are all connected to the power supply ground pins 832 through zigzag wiring, the third column of the conductive structures 813 are all connected to the power supply ground pins 832 through zigzag wiring, the fourth column of the conductive structures 813 are all connected to the power supply output pins 831 through zigzag wiring, and the fifth column of the conductive structures 813 are all connected to the power supply output pins 831 through zigzag wiring. The positions of the power supply output pins 831 and the power supply ground pins 832 of the power supply apparatus 83 both correspond to the conductive structures 813 of the same polarity, and all conductive structures 813 can pass current without exceeding their through-current capability. Capacitor pins, of two adjacent output capacitors 84, facing with each other in the second direction x are of a same polarity. Each of the power supply pins and an adjacent pin of the output capacitor 84 are of a same polarity. The output capacitors 84 can be neatly arranged, and it is easier to lead out the pins of the power supply apparatus 83. For example, in the views of FIG. 30(*a*) and FIG. 30(*b*), in the second direction x, the right end of the first column of the output capacitors 84 and the left end of the second column of the output capacitors 84 are facing with each other, and are of the same polarity; the right end of the second column of the output capacitors 84 and the left end of the third column of the output capacitors 84 are facing with each other, and are of the same polarity, and so on, and the subsequent columns of the output capacitors 84 have the same characteristics. The space between two adjacent columns of the output capacitors 84 may be left for the pins of the power supply apparatus 83 to make connections.

Figure 31:
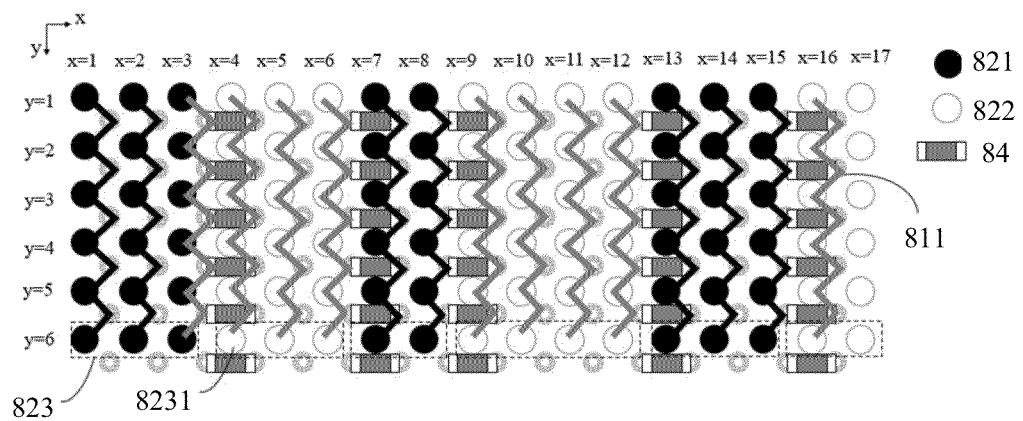
FIG. 31 is a schematic structure diagram of the electronic device according to yet another embodiment of the present disclosure, showing a schematic diagram of yet another arrangement of the power supply region of the load.

As shown in FIG. 31, a schematic diagram of yet another arrangement manner of the power supply region according to yet another embodiment of the present disclosure is shown. The difference between this arrangement manner and the arrangement manners shown in FIGS. 29(a) and 29(b) and FIGS. 30(a) and 30(b) is that each row of the load pins on the power supply region is a first arrangement row, i.e., there is no second arrangement row, and the load pins of the same column of the power supply region is of the same polarity. This structure has the same main advantages as the structures in FIGS. 29(a) and 29(b) and FIGS. 30(a) and 30(b). The output capacitors 84 used for filtering are placed at the back side of the system board 81, and the output capacitors 84 are closer to the load input pins 821 and the load ground pins 822, which results in a better filtering effect, and the output capacitors 84 and the power supply apparatus 83 are reasonably placed to avoid each other. The two terminals of the output capacitor 84 may be neatly distributed at two sides of the centerline, in the third direction y, of the first position pin of each load pin groups of the first arrangement row. The power supply pins of the power supply apparatus 83 are more regularly connected to the system board 81, and there are more conductive structures 813 to carry the current of the power supply apparatus 83. The load pins of one column adjacent to a first side of the vertical projection of each column of the output capacitors 84 on the power supply region are of a same polarity, the load pins of another column adjacent to a second side of the vertical projection of each column of the output capacitors 84 on the power supply region are of a same polarity, and the load pins of the one column adjacent to the first side and the load pins of the another column adjacent to the second side are of opposite polarities. The conductive structures 813 of a same column are connected to the power supply pins of the same polarity. Capacitor pins, of two adjacent output capacitors 84, facing with each other in the second direction x are of a same polarity. In addition to the similar advantages as in FIGS. 29(a) and 29(b) and FIGS. 30(a) and 30(b), this neat and regular arrangement facilitates the design of the internal wiring of the processor, especially for processor chips with larger sizes and more pins.

As shown in FIGS. 29 and 30, one embodiment of the present disclosure also provides a power supply apparatus 83, configured to supply power to a load 82 on a system board 3. The system board 81 includes a first side 811 and a second side 812 located opposite to each other along a first direction. The load 82 is located on the first side of the system board, and includes a power supply region. The power supply region includes load pins arranged in a plurality of rows along a second direction and in a plurality of columns along a third direction. The power supply apparatus 83 is located on the second side of the system board, one side of the power supply apparatus 83 facing the system board is provided with a plurality of power supply pins, and each of the power supply pins is connected to the load pin of a same polarity through a conductive structure of the system board 81. At least one column of output capacitors is connected between the power supply apparatus 83 and the load 82, and each column of the output capacitors is located on the second side of the system board along the third direction. At least one row of the load pins is a first arrangement row, and the first arrangement row includes a plurality of load pin groups arranged sequentially along the second direction. Each of the load pin groups includes at least two load pins of a same polarity, and each of the load pin groups and an adjacent load pin group are of opposite polarities. A first load pin in the second direction of each of the load pin groups in the first arrangement row is a first position pin, and two ends of a vertical projection of each column of the output capacitors on the power supply region are located at two sides of a centerline, in the third direction, of at least one first position pin. The first direction, the second direction and the third direction are perpendicular to each other. The pins of the power supply apparatus can be neatly arranged, and easy to manufacture, reducing manufacturing costs; because the pins are neat, the power supply apparatus is easy to weld with the system board, improving production efficiency.

As shown in FIGS. 29 to 31, one embodiment of the present disclosure also provides a load 82. The load 82 includes a power supply region. The power supply region includes load pins arranged in a plurality of rows along a second direction and in a plurality of columns along a third direction. At least one row of the load pins is a first arrangement row, the first arrangement row includes a plurality of load pin groups arranged sequentially along the second direction. Each of the load pin groups includes at least two load pins of a same polarity, and each of the load pin groups and an adjacent load pin group are of opposite polarities. The power supply region further includes at least one second arrangement row. An arrangement of the load pins of the second arrangement row is shifted by one load pin along the second direction relative to an arrangement of the load pins of the first arrangement row, and the at least one first arrangement row and the at least one second arrangement row are provided adjacent to each other. The second direction and the third direction are perpendicular to each other. The load can be arranged in a specific arrangement manner of pins to make the pins of the same polarity more concentrated, and the pins of different polarities arranged alternatively, providing convenience for the placement of filter capacitors. At the same time, the combination of the first and second arrangement rows facilitates the system board to connect pins of the same polarity through zigzag wiring, making it easier for board design.

In some embodiments, the power supply region includes at least two rows of first arrangement rows and at least two rows of second arrangement rows, and the first arrangement rows and the second arrangement rows are arranged alternately. In some embodiments, each of the load pin groups of the first arrangement row includes a same number of the load pins.

As shown in FIGS. 29 to 31, one embodiment of the present disclosure also provides an electronic device 100, including the load 82 described above. The electronic device 100 further includes a power supply apparatus 83, at least one column of output capacitors 84, and a system board 81. The system board 81 includes a first side 811 and a second side 812 located opposite to each other along a first direction. The load 82 is located on the first side 811 of the system board 81. The power supply apparatus 83 and the output capacitors 84 are located on the second side 812 of the system board 81.

The power supply apparatus, load and electronic device provided in the present disclosure have the following advantages.

By using the technical solutions of the present disclosure, the output capacitors used for filtering are placed at the back side of the system board, and the output capacitors are closer to the load input pins and the load ground pins, which results in a better filtering effect; and the output capacitors and the power supply apparatus are reasonably placed to avoid each other. The positions of the power supply output pins and power supply ground pins of the power supply apparatus both correspond to conductive structures of the same polarity, and all conductive structures can pass current without exceeding their through-current capability. The output capacitors can be neatly arranged, and it is easier to lead out the pins of the power supply apparatus.

The above is a further detailed description of the present disclosure in conjunction with specific preferred embodiments, and it cannot be assumed that the specific implementation of the present disclosure is limited to these descriptions. For those ordinary skilled in the art to which the present disclosure belongs, a number of simple derivations or substitutions can be made without departing from the idea of the present disclosure, all of which should be regarded as falling within the protection scope of the present disclosure.

What is claimed is:

1. An electronic device, comprising:
    a system board, comprising a first side and a second side, wherein the first side and the second side are located opposite to each other along a first direction;
    a load, located on the first side of the system board and comprising a power supply region, wherein the power supply region comprises load pins arranged in a plurality of rows along a second direction and in a plurality of columns along a third direction, wherein the load pins comprise load input pins and load ground pins; and
    at least one column of output capacitors, wherein each column of the output capacitors is located on the second side of the system board along the third direction; wherein
    at least one row of the load pins is a first arrangement row, and the first arrangement row comprises a plurality of load input pin groups and a plurality of load ground pin groups alternately arranged along the second direction, wherein each of the load input pin groups comprises at least two load input pins, each of the load ground pin groups comprises at least two load ground pins;
    a first load pin in the second direction of each of the load input pin groups and the load ground pin groups in the first arrangement row is a first position pin, and two ends of a vertical projection of each column of the output capacitors on the power supply region are located at two sides of a centerline, in the third direction, of at least one first position pin; and
    the first direction, the second direction and the third direction are perpendicular to each other.

2. The electronic device according to claim 1, further comprising:
    a power supply apparatus, located on the second side of the system board, wherein one side of the power supply apparatus facing the system board is provided with a plurality of power supply pins; each of the power supply pins is connected to the load pin of a same polarity through a conductive structure of the system board; and the output capacitors are connected between the power supply apparatus and the load.

3. The electronic device according to claim 1, wherein each row of the load pins is the first arrangement row, and the load pins of a same column of the power supply region are of a same polarity.

4. The electronic device according to claim 1, wherein at least one row of the load pins is a second arrangement row, wherein an arrangement of the load pins of the second arrangement row is shifted by one load pin along the second direction relative to an arrangement of the load pins of the first arrangement row; and
    a first load pin and a second load pin, in the second direction, of the second arrangement row are of opposite polarities.

5. The electronic device according to claim 1, wherein the first position pin of each of the load input pin groups and the load ground pin groups of one first arrangement row corresponds to one column of the output capacitors, and the two ends of the vertical projection of each column of the output capacitors on the power supply region are located at two sides of the centerline, in the third direction, of the corresponding first position pin.

6. The electronic device according to claim 1, wherein in the third direction, a vertical projection of the output capacitor on the power supply region is located between two adjacent rows of the load pins;
    the at least one column of the output capacitors comprises a plurality of columns of the output capacitors, and in the third direction, one row of the output capacitors is provided between every two adjacent rows of the load pins.

7. The electronic device according to claim 1, the load pins of one column adjacent to a first side of the vertical projection of each column of the output capacitors on the power supply region are of a same polarity, the load pins of another column adjacent to a second side of the vertical projection of each column of the output capacitors on the power supply region are of a same polarity, and the load pins of the one column adjacent to the first side and the load pins of the another column adjacent to the second side are of opposite polarities.

8. The electronic device according to claim 2, wherein the power supply pins of the power supply apparatus comprise power supply output pins and power supply ground pins, wherein the power supply output pins and the power supply ground pins are provided alternately in the second direction.

9. The electronic device according to claim 8, wherein the at least one column of the output capacitors comprises a plurality of columns of the output capacitors, wherein each of the power supply pins is provided between two adjacent columns of the output capacitors.

10. The electronic device according to claim 9, wherein in the second direction, a length of each of the power supply pins is less than or equal to a center distance between two adjacent first position pins minus a length of the output capacitor.

11. The electronic device according to claim 9, wherein the conductive structure comprises a via or a blind buried hole;
    a plurality of columns of conductive structures are provided at a position of the system board corresponding to the power supply region, each column of the conductive structures is located at one side of one column of the output capacitors, and each of the conductive structures is aligned with an adjacent output capacitor in the second direction.

12. The electronic device according to claim 11, wherein the conductive structures of a same column are connected to the power supply pins of a same polarity.

13. The electronic device according to claim 1, wherein the at least one column of the output capacitors comprises a plurality of columns of the output capacitors, and capacitor pins, of two adjacent output capacitors, facing with each other in the second direction are of a same polarity.

14. The electronic device according to claim 2, wherein each of the power supply pins and an adjacent pin of the output capacitor are of a same polarity.

15. The electronic device according to claim 1, wherein in the first arrangement row, each of the load input pin groups is provided with a same number of load input pins, and each of the load ground pin groups is provided with a same number of load ground pins.

16. The electronic device according to claim 1, wherein the power supply region comprises a plurality of first arrangement rows, and the load pins of the plurality of the first arrangement rows are arranged in a same form; and the power supply region comprises at least three rows and at least six columns of the load pins, and the at least one column of the output capacitors comprises at least two rows and at least two columns of the output capacitors.

17. A power supply apparatus, configured to supply power to a load on a system board, wherein the system board comprises a first side and a second side, wherein the first side and the second side are located opposite to each other along a first direction;

the load is located on the first side of the system board and comprises a power supply region, wherein the power supply region comprises load pins arranged in a plurality of rows along a second direction and in a plurality of columns along a third direction, wherein the load pins comprise load input pins and load ground pins;

the power supply apparatus is located on the second side of the system board, one side of the power supply apparatus facing the system board is provided with a plurality of power supply pins, and each of the power supply pins is connected to the load pin of a same polarity through a conductive structure of the system board;

at least one column of output capacitors is connected between the power supply apparatus and the load, and each column of the output capacitors is located on the second side of the system board along the third direction;

at least one row of the load pins is a first arrangement row, and the first arrangement row comprises a plurality of load input pin groups and a plurality of load ground pin groups alternately arranged along the second direction, wherein each of the load input pin groups comprises at least two load input pins, each of the load ground pin groups comprises at least two load ground pins;

a first load pin in the second direction of each of the load input pin groups and the load ground pin groups in the first arrangement row is a first position pin, and two ends of a vertical projection of each column of the output capacitors on the power supply region are located at two sides of a centerline, in the third direction, of at least one first position pin; and the first direction, the second direction and the third direction are perpendicular to each other.

18. A load, comprising:

a power supply region, wherein the power supply region comprises load pins arranged in a plurality of rows along a second direction and in a plurality of columns along a third direction, wherein the load pins comprise load input pins and load ground pins; wherein at least one row of the load pins is a first arrangement row, the first arrangement row comprises a plurality of load input pin groups and a plurality of load ground pin groups alternately arranged along the second direction, wherein each of the load input pin groups comprises at least two load input pins, each of the load ground pin groups comprises at least two load ground pins;

at least one row of the load pins is a second arrangement row, wherein an arrangement of the load pins of the second arrangement row is shifted by one load pin along the second direction relative to an arrangement of the load pins of the first arrangement row;

the at least one first arrangement row and the at least one second arrangement row are provided adjacent to each other; and the second direction and the third direction are perpendicular to each other.

19. The load according to claim 18, wherein the power supply region comprises at least two rows of first arrangement rows and at least two rows of second arrangement rows, wherein the first arrangement rows and the second arrangement rows are arranged alternately.

20. The load according to claim 18, wherein each of the load input pin groups and the load ground pin groups of the first arrangement row comprises a same number of the load pins.

* * * * *